US012760048B2

(12) United States Patent
Hotta et al.

(10) Patent No.: US 12,760,048 B2
(45) Date of Patent: Oct. 13, 2026

(54) COMPOSITION CONTAINING IRIDIUM COMPLEX, ORGANIC LIGHT-EMITTING ELEMENT, DISPLAY DEVICE, IMAGE PICKUP DEVICE, ELECTRONIC DEVICE, ILLUMINATION APPARATUS, AND MOVING OBJECT

(71) Applicant: CANON KABUSHIKI KAISHA, Tokyo (JP)

(72) Inventors: Katsuyuki Hotta, Kanagawa (JP); Tomokazu Tsuji, Fukui (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 833 days.

(21) Appl. No.: 18/311,767

(22) Filed: May 3, 2023

(65) Prior Publication Data

US 2023/0276695 A1 Aug. 31, 2023

Related U.S. Application Data

(63) Continuation of application No. PCT/JP2021/040507, filed on Nov. 4, 2021.

(30) Foreign Application Priority Data

Nov. 5, 2020 (JP) ................................. 2020-185369

(51) Int. Cl.

| | |
|---|---|
| ***H01L 51/54*** | (2006.01) |
| ***C07F 15/00*** | (2006.01) |
| ***C09K 11/06*** | (2006.01) |
| ***H10K 85/30*** | (2023.01) |
| *H10K 50/11* | (2023.01) |
| *H10K 101/10* | (2023.01) |

(52) U.S. Cl.

CPC .......... *C07F 15/0033* (2013.01); *C09K 11/06* (2013.01); *H10K 85/342* (2023.02); *C09K 2211/1007* (2013.01); *C09K 2211/1011* (2013.01); *C09K 2211/1029* (2013.01); *C09K 2211/185* (2013.01); *H10K 50/11* (2023.02); *H10K 2101/10* (2023.02)

(58) Field of Classification Search

None

See application file for complete search history.

(56) References Cited

U.S. PATENT DOCUMENTS

| | | | | |
|---|---|---|---|---|
| 2015/0372244 | A1 | 12/2015 | Abe | |
| 2019/0036046 | A1 | 1/2019 | Sasada | |
| 2020/0111977 | A1 | 4/2020 | Choi | |
| 2020/0212319 | A1* | 7/2020 | Choi | C07F 15/0033 |

FOREIGN PATENT DOCUMENTS

| | | | |
|---|---|---|---|
| EP | 1722603 | A1 | 11/2006 |
| EP | 3410508 | A1 | 12/2018 |
| EP | 3674308 | A1 | 7/2020 |
| JP | 2014154615 | A | 8/2014 |
| JP | 2017204475 | A | 11/2017 |
| JP | 2020059709 | A | 4/2020 |
| JP | 2020109084 | A | 7/2020 |
| KR | 20070004678 | A | 1/2007 |
| KR | 20180104086 | A | 9/2018 |
| KR | 20200040198 | A | 4/2020 |
| KR | 20200083198 | A | 7/2020 |
| KR | 20200115008 | A | 10/2020 |
| KR | 20200115010 | A | 10/2020 |
| KR | 20200115011 | A | 10/2020 |
| WO | 2005084083 | A1 | 9/2005 |
| WO | 2014203540 | A1 | 12/2014 |
| WO | 2017130977 | A1 | 8/2017 |

* cited by examiner

*Primary Examiner* — Andrew K Bohaty

(74) *Attorney, Agent, or Firm* — Canon U.S.A., Inc. IP Division

(57) ABSTRACT

The present disclosure provides a composition containing an iridium complex represented by general formula (1) below and a halogen atom. The content of the halogen atom is less than 5 ppm.

[1]

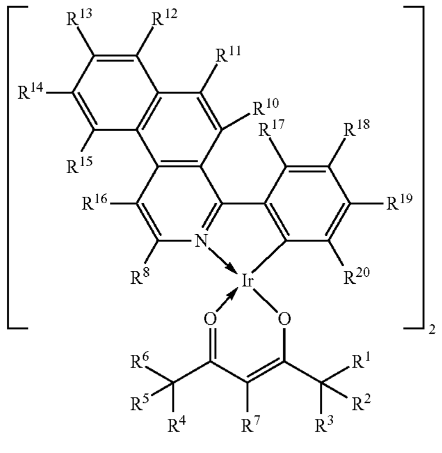

In general formula (1), $R^8$ to $R^{20}$ are each a hydrogen atom or a substituent. $R^{14}$ is an electron-withdrawing substituent having a Hammett constant σm of 0.3 or more, and $R^1$ to $R^7$ are each a hydrogen atom or a methyl group.

16 Claims, 6 Drawing Sheets

COMPOSITION CONTAINING IRIDIUM COMPLEX, ORGANIC LIGHT-EMITTING ELEMENT, DISPLAY DEVICE, IMAGE PICKUP DEVICE, ELECTRONIC DEVICE, ILLUMINATION APPARATUS, AND MOVING OBJECT

CROSS-REFERENCE TO RELATED APPLICATIONS

This application is a Continuation of International Patent Application No. PCT/JP2021/040507, filed Nov. 4, 2021, which claims the benefit of Japanese Patent Application No. 2020-185369, filed Nov. 5, 2020, both of which are hereby incorporated by reference herein in their entirety.

TECHNICAL FIELD

The present disclosure relates to a composition containing an iridium complex having high durability, an organic light-emitting element including the composition, a display device, an image pickup device, an electronic device, an illumination apparatus, and a moving object.

BACKGROUND ART

An organic light-emitting element (also referred to as an organic electroluminescent element (organic EL element)) is an electronic element including a pair of electrodes and an organic compound layer disposed between the electrodes. By injecting electrons and holes through the pair of electrodes, excitons of a luminescent organic compound in the organic compound layer are generated. The organic light-emitting element emits light when the excitons return to their ground state.

Recent progress in organic light-emitting elements has been noticeable. For example, low driving voltages, various emission wavelengths, high-speed response, and thinner and lighter light-emitting devices have been enabled.

Currently, the use of phosphorescence has been proposed as an attempt to improve the light emission efficiency of organic EL elements. Organic EL elements utilizing phosphorescence are expected to have improved light emission efficiency theoretically about four times the light emission efficiency of those utilizing fluorescence. Thus, phosphorescent organometallic complexes have been actively created to date. This is because creation of organometallic complexes having excellent light-emitting properties is important for providing high-performance organic light-emitting elements.

Organometallic complexes created so far include the following compound 1-a disclosed in PTL 1.

1-a

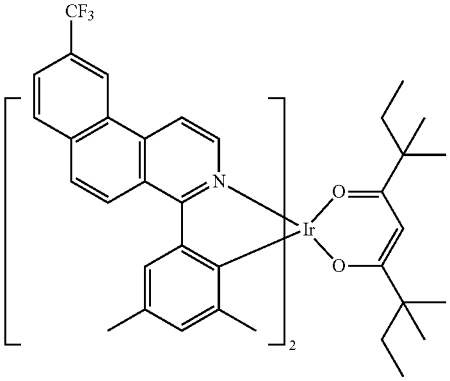

CITATION LIST

Patent Literature

PTL 1: Japanese Patent Laid-Open No. 2020-109084

The exemplary compound in PTL 1 is an organic compound including a ligand including a benzene ring having two alkyl groups and a ring structure in which a ring derived from fusion of two benzene rings and one pyridine ring has a trifluoromethyl group. The Ir atom is also provided with an ancillary ligand, and the ancillary ligand has, as substituents, ethyl groups which are alkyl groups having two carbon atoms.

As a result of intensive studies, the present inventors have found that the above ligand is more easily influenced than other ligands particularly by halogen atoms and determined the halogen content that provides properties better than before by reducing the amount of halogen atoms coexisting with an organometallic complex having the above ligand.

SUMMARY OF INVENTION

The present invention has been made in view of the above problem, and an object thereof is to provide a composition containing an iridium complex having high durability.

The present invention provides a composition containing an iridium complex represented by general formula below and a halogen atom. In the composition, the content of the halogen atom is less than 5 ppm.

[1]

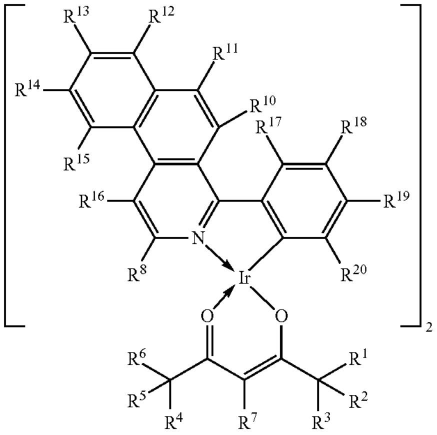

In general formula (1), $R^8$ to $R^{20}$ are each independently selected from a hydrogen atom, a halogen atom, a substituted or unsubstituted alkyl group, a substituted or unsubstituted aryl group, a substituted or unsubstituted heterocyclic group, a substituted or unsubstituted alkoxy group, a substituted or unsubstituted aryloxy group, a cyano group, and a silyl group.

$R^{14}$ is an electron-withdrawing substituent having a Hammett constant σm of 0.3 or more, and $R^1$ to $R^7$ are each a hydrogen atom or a methyl group.

Further features of the present invention will become apparent from the following description of exemplary embodiments with reference to the attached drawings.

DESCRIPTION OF EMBODIMENTS

Figure 1A:
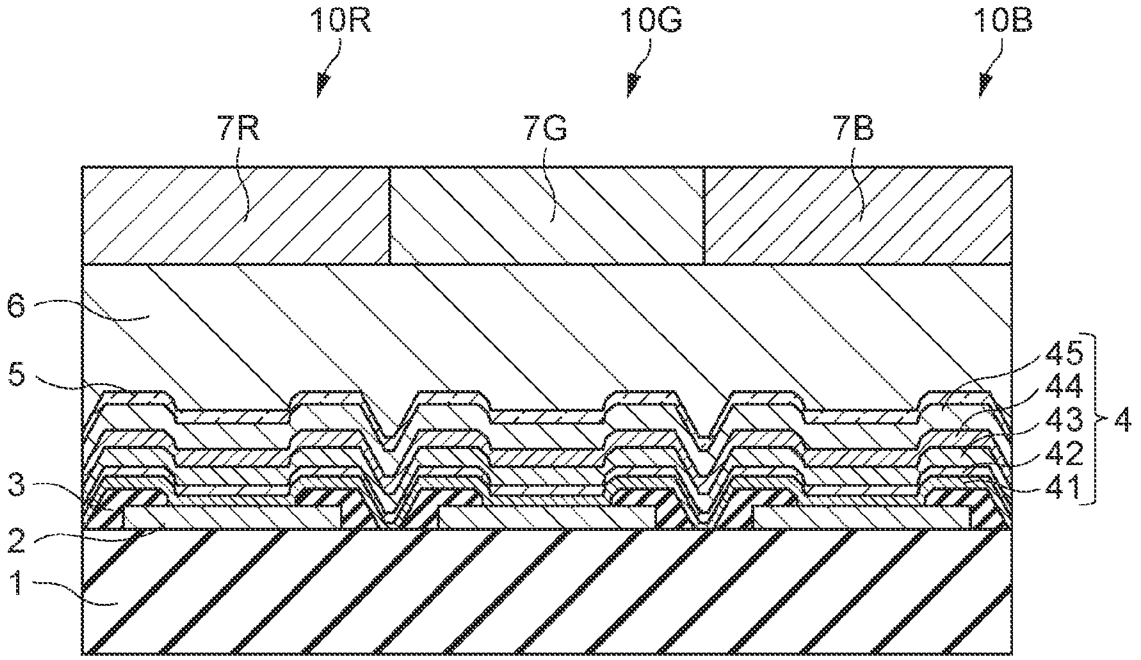
FIG. 1A is a schematic sectional view showing an example of a pixel of a display device according to an embodiment of the present invention.

The present invention is a composition containing an iridium complex represented by general formula (1) below.

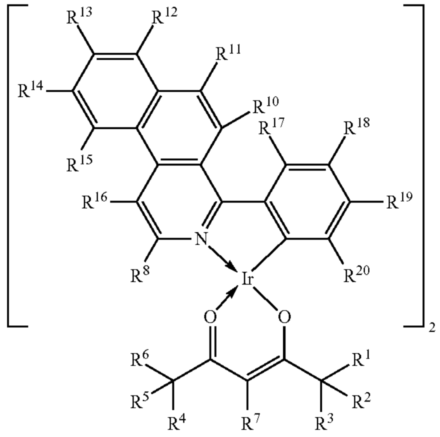

(1)

In general formula (1), $R^8$ to $R^{20}$ are each independently selected from a hydrogen atom, a halogen atom, a substituted or unsubstituted alkyl group, a substituted or unsubstituted aryl group, a substituted or unsubstituted heterocyclic group, a substituted or unsubstituted alkoxy group, a substituted or unsubstituted aryloxy group, a substituted or unsubstituted amino group, a cyano group, and a silyl group. $R^{14}$ is an electron-withdrawing substituent having a Hammett constant σm of 0.3 or more, and $R^1$ to $R^7$ are each a hydrogen atom or a methyl group.

In this specification, examples of halogen atoms include fluorine, chlorine, bromine, and iodine, but are not limited thereto.

In this specification, examples of alkyl groups include alkyl groups having 1 to 10 carbon atoms, preferably 1 to 8 carbon atoms, more preferably 1 to 4 carbon atoms. Specific examples include a methyl group, an ethyl group, a normal propyl group, an isopropyl group, a normal butyl group, a tertiary butyl group, a secondary butyl group, an octyl group, a cyclopentyl group, a cyclohexyl group, a 1-adamantyl group, and a 2-adamantyl group, but are not limited thereto.

In this specification, examples of alkoxy groups include alkoxy groups having 1 to 10 carbon atoms, preferably 1 to 6 carbon atoms, more preferably 1 to 4 carbon atoms. Specific examples include a methoxy group, an ethoxy group, a propoxy group, 2-ethyl-hexyloxy group, and a benzyloxy group, but are not limited thereto.

In this specification, examples of amino groups include an unsubstituted amino group and amino groups substituted with any one of an alkyl group, an aryl group, and an amino group. The alkyl group, the aryl group, and the amino group may have a halogen atom as a substituent. The aryl group and the amino group may have an alkyl group as a substituent. Alkyl substituents on the amino group may be bonded to each other to form a ring. Specific examples include an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisolylamino group, an N-mesityl-N-phenylamino group, an N,N-dimesitylamino group, an N-phenyl-N-(4-tert-butylphenyl)amino group, an N-phenyl-N-(4-trifluoromethylphenyl)amino group, and an N-piperidyl group, but are not limited thereto.

In this specification, examples of aryl groups include aryl groups having 6 to 18 carbon atoms. Specific examples include a phenyl group, a naphthyl group, an indenyl group, a biphenyl group, a terphenyl group, a fluorenyl group, a phenanthryl group, and a triphenylenyl group.

In this specification, examples of heterocyclic groups include heterocyclic groups having 3 to 15 carbon atoms. The heterocyclic groups may have nitrogen, sulfur, or oxygen as a heteroatom. Specific examples include a pyridyl group, a pyrazyl group, a pyrimidyl group, a triazyl group, an imidazolyl group, an oxazolyl group, an oxadiazolyl group, a thiazolyl group, a thiadiazolyl group, a carbazolyl group, an acridinyl group, a phenanthrolyl group, a furanyl group, a thiophenyl group, a dibenzofuranyl group, and a dibenzothiophenyl group, but are not limited thereto.

In this specification, examples of aryloxy groups include a phenoxy group and a thienyloxy group, but are not limited thereto.

In this specification, examples of silyl groups include a trimethylsilyl group and a triphenylsilyl group, but are not limited thereto.

The above alkyl groups, alkoxy groups, amino groups, aryl groups, heterocyclic groups, and aryloxy groups may have a halogen atom as a substituent. The halogen atom is, for example, fluorine, chlorine, or bromine and may be a fluorine atom. In particular, the alkyl group may have a fluorine atom to be a trifluoromethyl group.

The above amino groups, aryl groups, heterocyclic groups, and aryloxy group may have an alkyl group as a substituent. The alkyl group may have 1 to 10 carbon atoms. More specifically, the alkyl group may be a methyl group, an ethyl group, a normal propyl group, an isopropyl group, a normal butyl group, or a tertiary butyl group.

The above alkyl groups, alkoxy groups, amino groups, aryl groups, heterocyclic groups, and aryloxy groups may have an aryl group as a substituent. The aryl group may have 6 to 12 carbon atoms. More specifically, the aryl group may be a phenyl group, a biphenyl group, or a naphthyl group.

The above alkyl groups, alkoxy groups, amino groups, aryl groups, heterocyclic groups, and aryloxy groups may have a heterocyclic group as a substituent. The heterocyclic group may have 3 to 9 carbon atoms. The heterocyclic group may have nitrogen, sulfur, or oxygen as a heteroatom. More specifically, the heterocyclic group may be a pyridyl group or a pyrrolyl group.

The above alkyl groups, alkoxy groups, amino groups, aryl groups, heterocyclic groups, and aryloxy groups may have an amino group as a substituent. The amino group may have an alkyl group or an aryl group, and alkyl groups on the amino group may be bonded to each other to form a ring. Specifically, the amino group may be a dimethylamino group, a diethylamino group, a dibenzylamino group, a diphenylamino group, or a ditolylamino group.

The above alkyl groups, alkoxy groups, amino groups, aryl groups, heterocyclic groups, and aryloxy groups may have, as a substituent, an aralkyl group such as a benzyl group, an alkoxy group such as a methoxy group, an ethoxy group, or a propoxy group, an aryloxy group such as a phenoxy group, a cyano group, or the like. The substituent is not limited to these examples.

Iridium Complex According to Present Invention

An iridium complex according to the present invention can improve the molecular stability of a light-emitting molecule to provide an organic EL element with an improved operating lifetime. It has been found that when an ancillary ligand has only hydrogen and an alkyl group having one carbon atom as in the iridium complex according to the present invention, introducing an electron-withdrawing substituent with strong electron-withdrawing properties in a specific position ($R^{14}$) of the benzoisoquinoline skeleton in general formula (1) improves the molecular stability.

The electron-withdrawing properties can be expressed by a Hammett constant, and providing an electron-withdrawing substituent having a Hammett constant of 0.3 or more can improve the stability. Especially, $—CF_3$, —CN, $—OCF_3$, $—COCH_3$, and $—COOCH_3$ are preferred, and $CF_3$ is particularly preferred.

$R^{18}$ and $R^{20}$ in general formula (1) are preferably a substituted or unsubstituted alkyl group, more preferably an alkyl group having 1 to 4 carbon atoms, particularly preferably a methyl group.

In view of the above, an iridium complex represented by the following structural formula is particularly preferred.

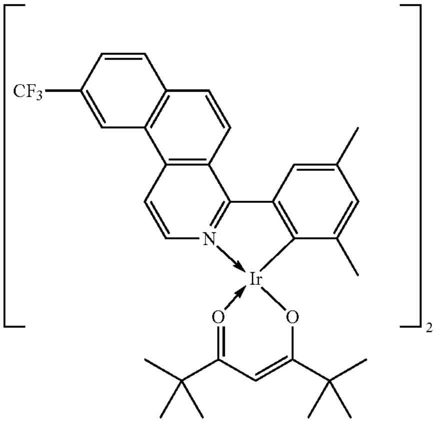

This iridium complex has $CF_3$ as an electron-withdrawing substituent on the benzoisoquinoline skeleton and two methyl groups on a phenyl group bonded to the iridium atom. Since these substituents are provided, the ligand having oxygen atoms, called an ancillary ligand, are provided only with methyl groups which are alkyl groups having one carbon atom. The methyl groups may be replaced with hydrogen atoms. In this manner, using a specific ligand and an ancillary ligand having a specific substituent can improve durability.

It has been unexpectedly found that this iridium complex more greatly reduces the operating lifetime of a device with respect to the amount of residual halogen than conventional compounds. Thus, the cross-coupling reaction between the benzoisoquinoline skeleton and the phenyl group is carried out under mild catalytic reaction conditions, whereby side reactions such as dehalogenation can be suppressed to reduce the amount of halogen contained in the iridium complex according to the present invention, thus improving element durability.

The amount of halogen contained in the composition containing the iridium complex according to the present invention is preferably less than 5 ppm, more preferably less than 3 ppm, still more preferably less than 1 ppm. The amount of halogen may be more than 0 ppm.

As described above, the iridium complex according to the present invention is an organic compound with high durability and suitable for use in an organic light-emitting element.

Examples of the organic compound according to the present invention will be given below, but the iridium complex of the present invention is not limited thereto.

Compound (1)
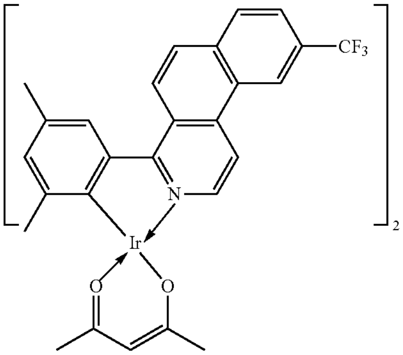
Compound (2)
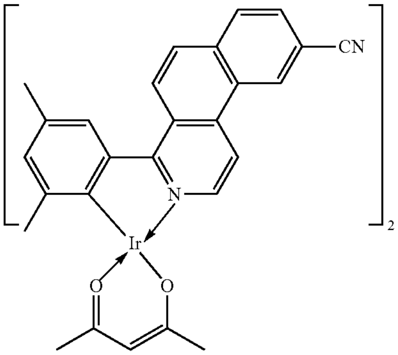
Compound (3)
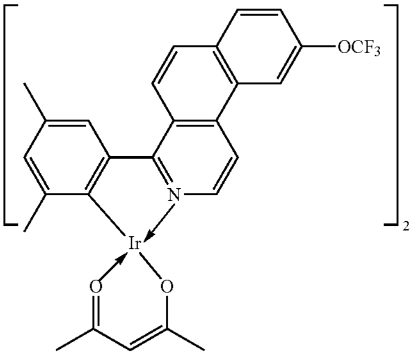
Compound (4)
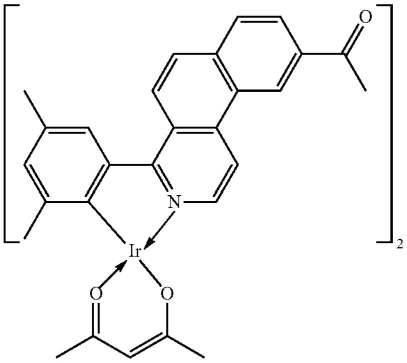
-continued
Compound (5)
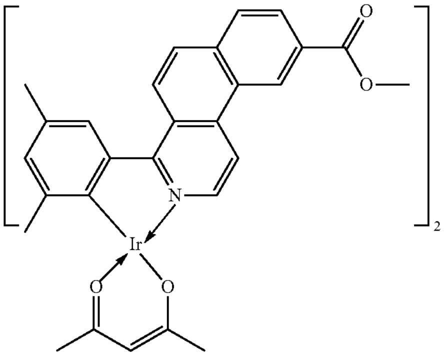
Compound (6)
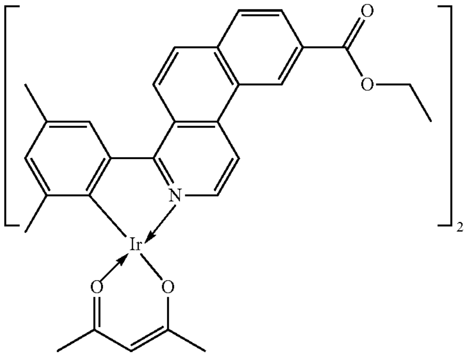
Compound (7)
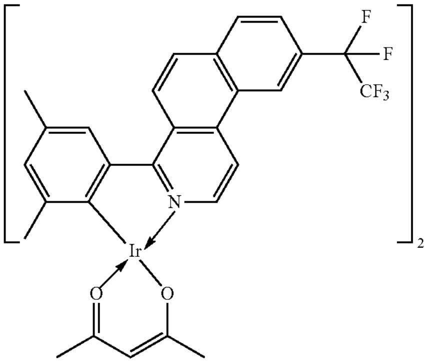
Compound (8)
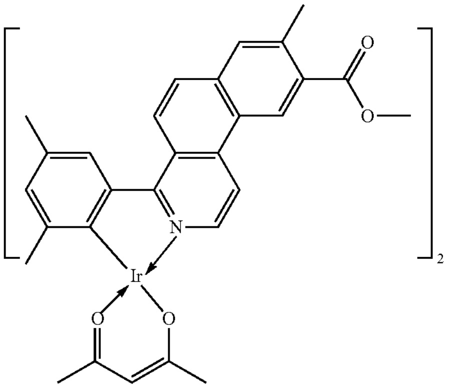

-continued
Compound (9)
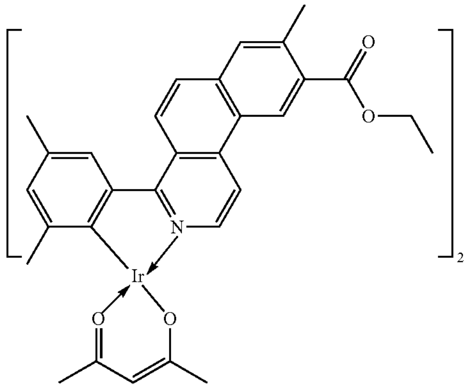
Compound (10)
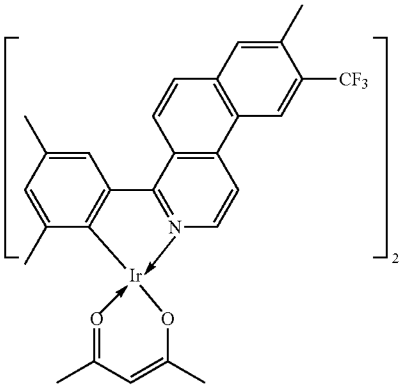
Compound (11)
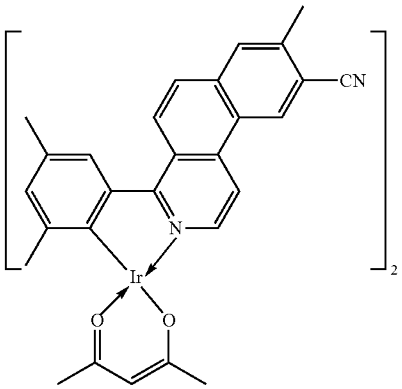
Compound (12)
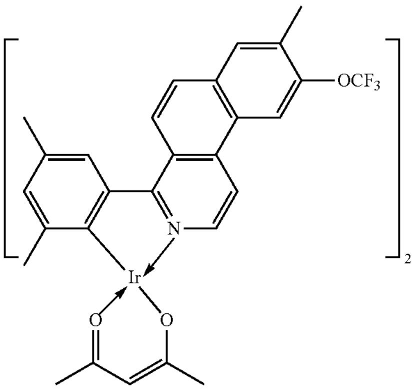
-continued
Compound (13)
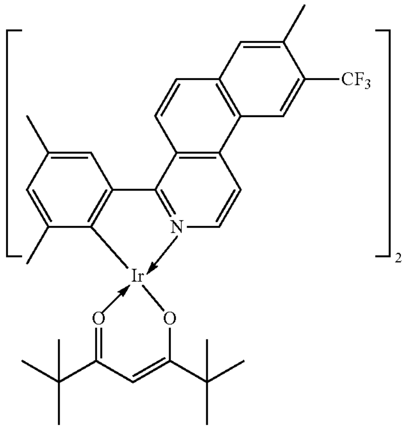
Compound (14)
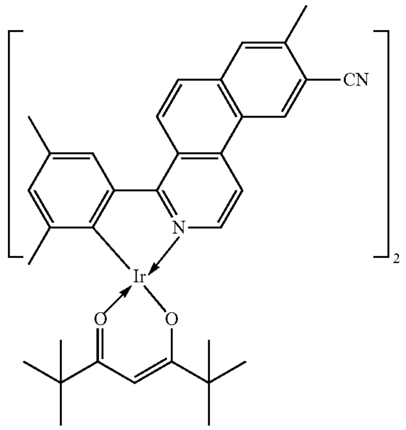
Compound (15)
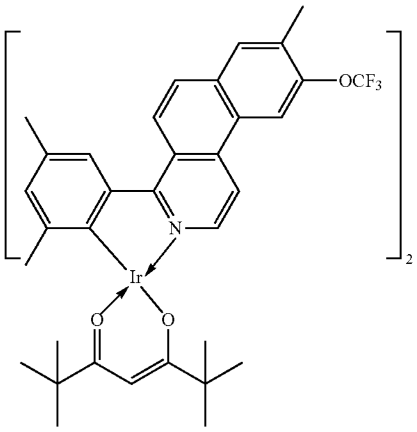

-continued
Compound (16)
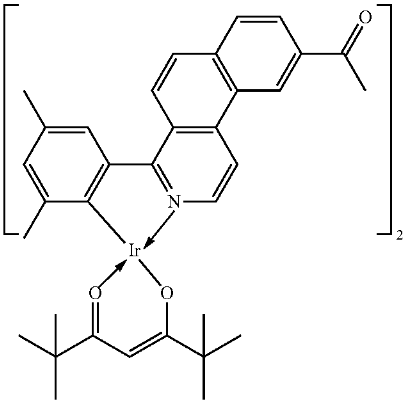
Compound (17)
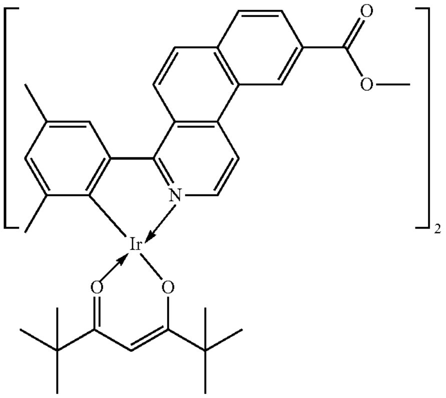
Compound (18)
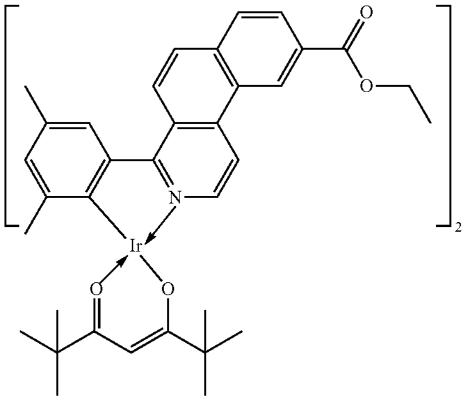
-continued
Compound (19)
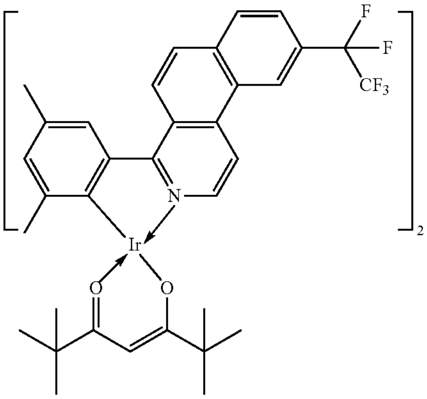
Compound (20)
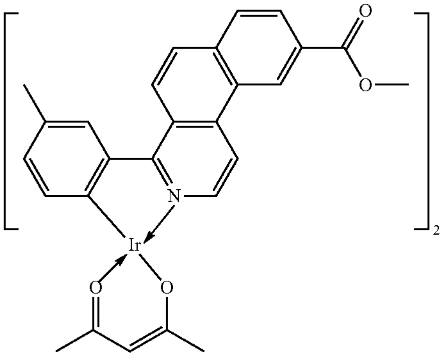
Compound (21)
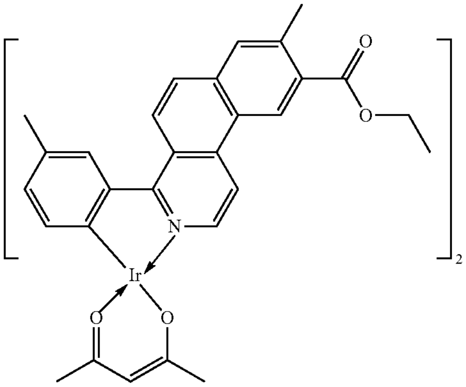
Compound (22)
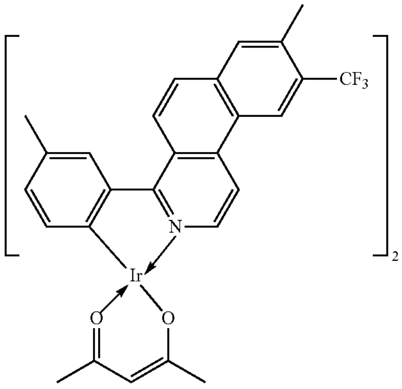

Compound (23)
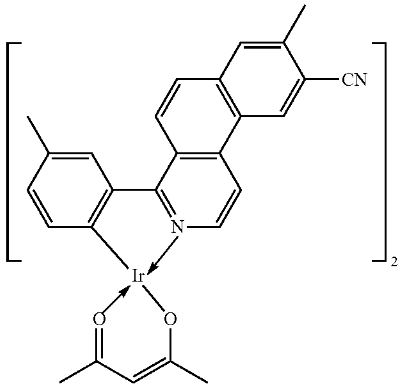
Compound (24)
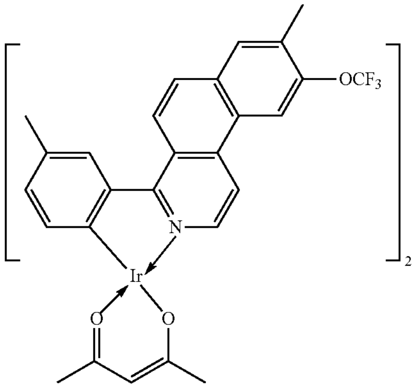
Compound (25)
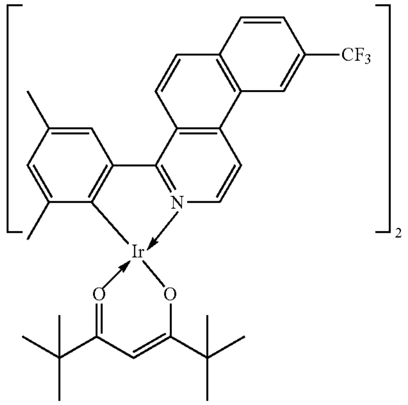
Compound (26)
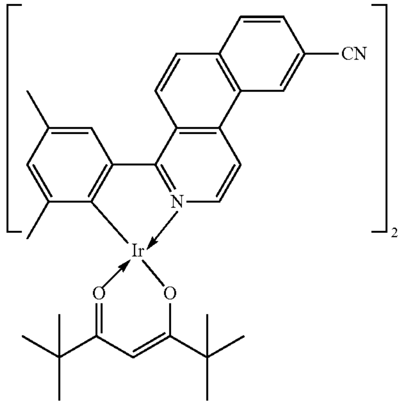
Compound (27)
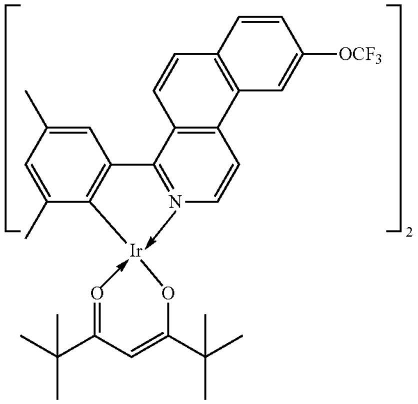
Compound (28)
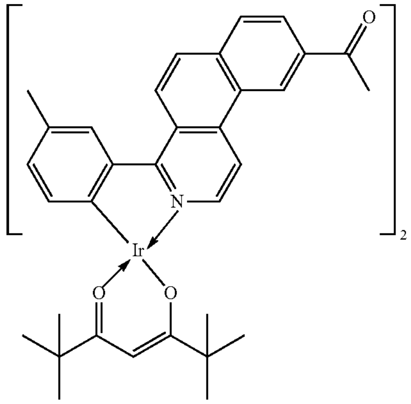
Compound (29)
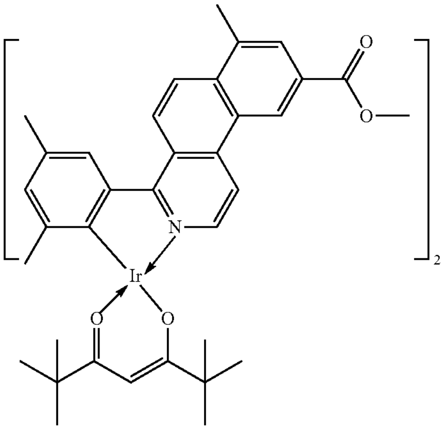

-continued
Compound (30)
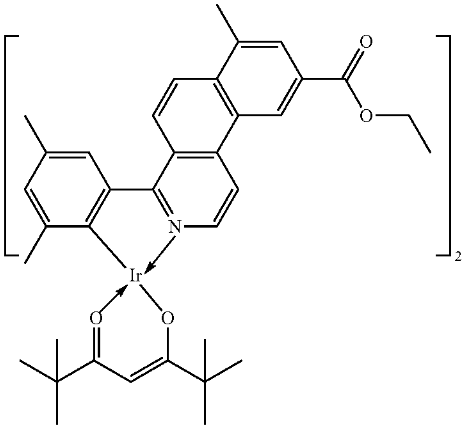
Compound (31)
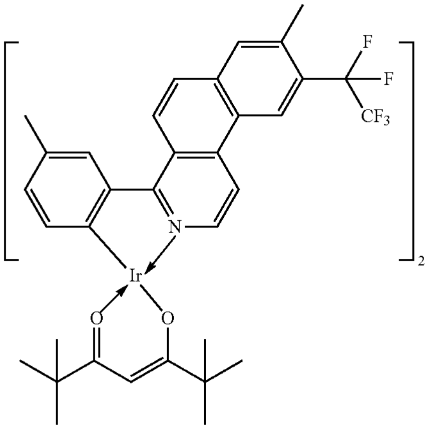
Compound (32)
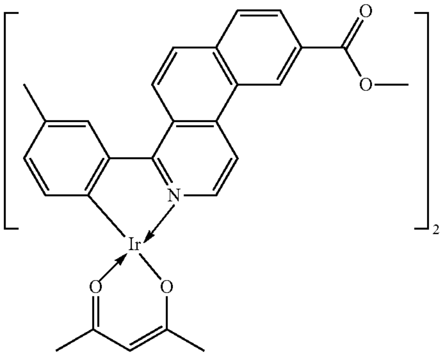
-continued
Compound (33)
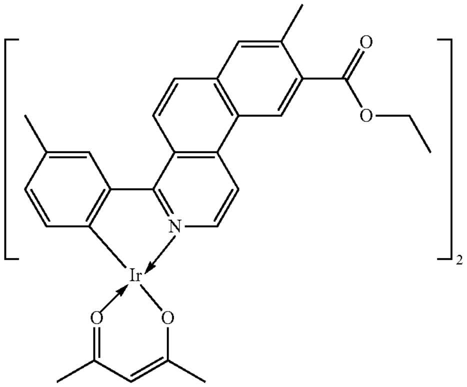
Compound (34)
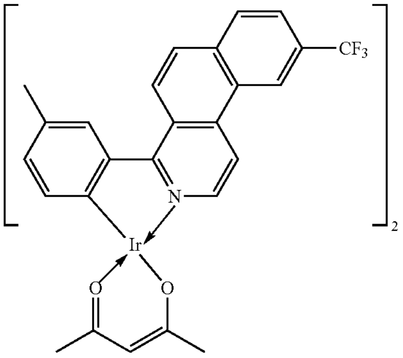
Compound (35)
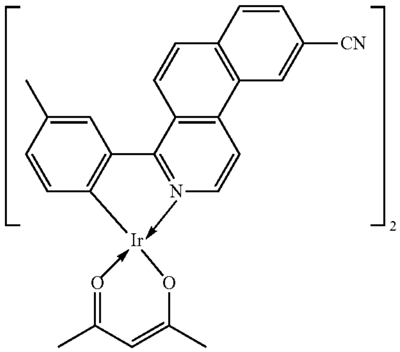
Compound (36)
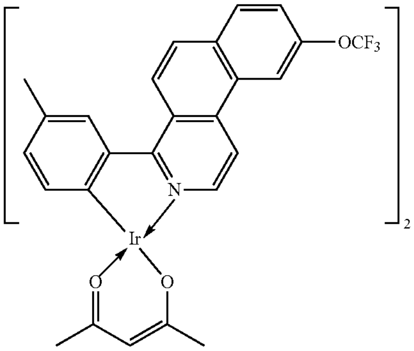

-continued
Compound (37)
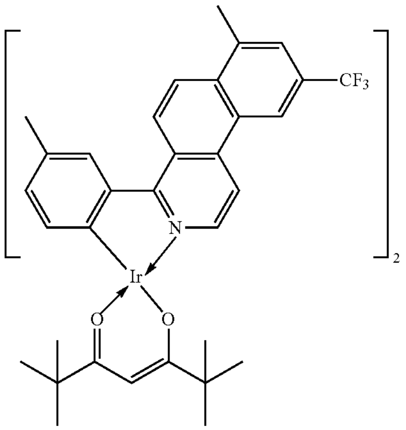
Compound (38)
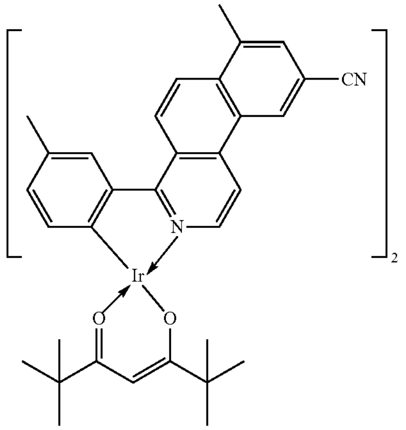
Compound (39)
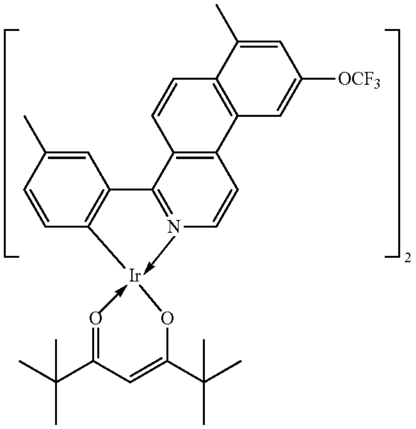
-continued
Compound (40)
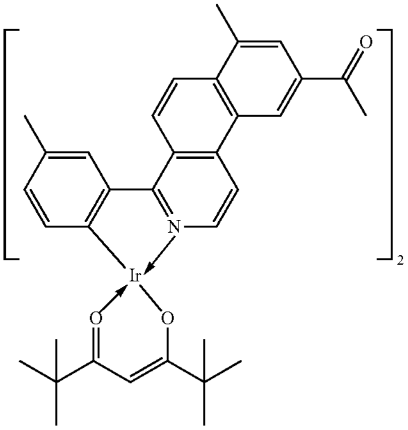
Compound (41)
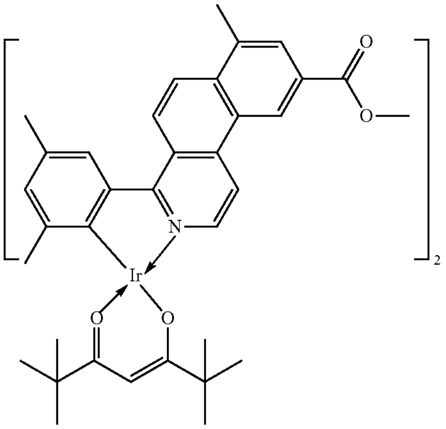
Compound (42)
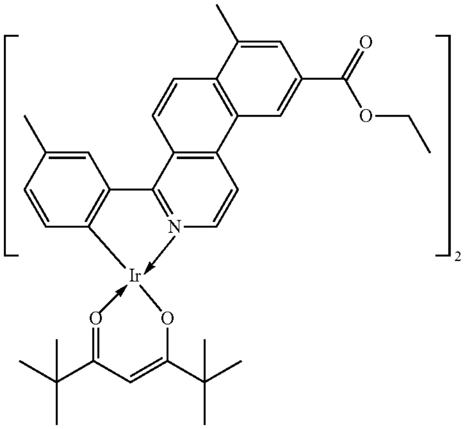

-continued

Compound (43)

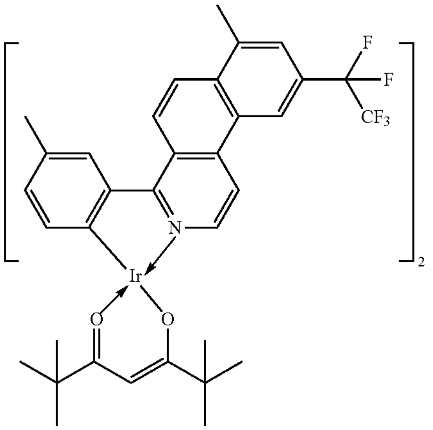

Compound (44)

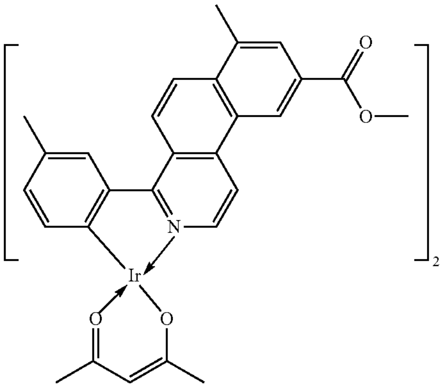

Compound (45)

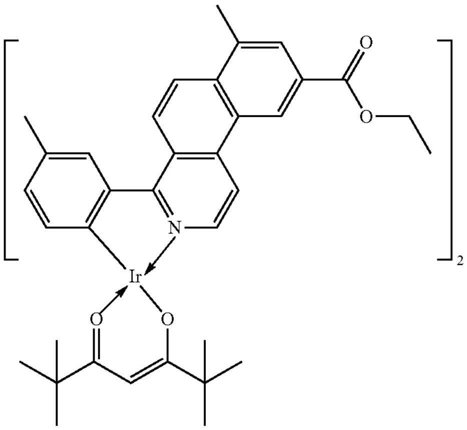

-continued

Compound (46)

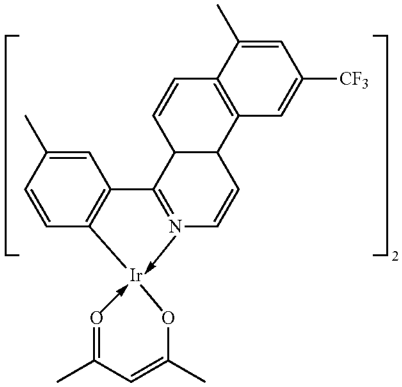

Compound (47)

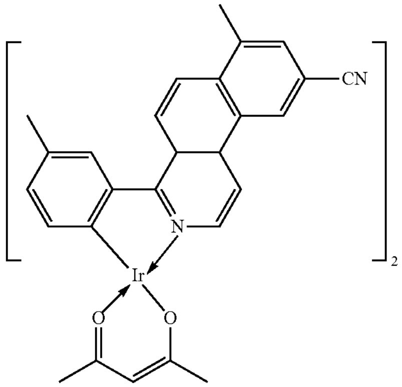

Compound (48)

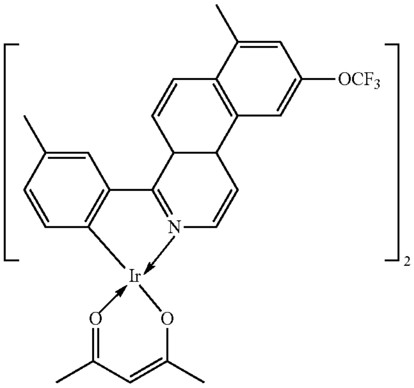

Organic Light-Emitting Element

Next, an organic light-emitting element according to this embodiment will be described. The organic light-emitting element according to this embodiment at least includes a first electrode, a second electrode, and an organic compound layer disposed between the electrodes. One of the first electrode and the second electrode is an anode, and the other is a cathode. In the organic light-emitting element according to this embodiment, the organic compound layer may be a single layer or a laminate of a plurality of layers as long as the organic compound layer includes a light-emitting layer. When the organic compound layer is a laminate of a plurality of layers, the organic compound layer may include, in addition to the light-emitting layer, a hole injection layer, a hole transport layer, an electron blocking layer, a hole/exciton blocking layer, an electron transport layer, an electron injection layer, and the like. The light-emitting layer may be a single layer or a laminate of a plurality of layers.

In the organic light-emitting element according to this embodiment, at least one layer of the organic compound layer contains the iridium complex according to this embodiment. Specifically, the organic compound according to this embodiment is contained in any of the light-emitting layer, the hole injection layer, the hole transport layer, the electron blocking layer, the hole/exciton blocking layer, the electron transport layer, the electron injection layer, and the like described above. The organic compound according to this embodiment is preferably contained in the light-emitting layer.

In the organic light-emitting element according to this embodiment, when the organic compound according to this embodiment is contained in the light-emitting layer, the light-emitting layer may be a layer formed only of the organic compound according to this embodiment or a layer formed of the organometallic complex according to this embodiment and other compounds. When the light-emitting layer is a layer formed of the organometallic complex according to this embodiment and other compounds, the organic compound according to this embodiment may be used as a host or a guest of the light-emitting layer. The organic compound may also be used as an assist material that can be contained in the light-emitting layer. Here, the host refers to a compound accounting for the largest mass proportion among the compounds constituting the light-emitting layer. The guest refers to a compound that accounts for a smaller mass proportion than the host among the compounds constituting the light-emitting layer and that is responsible for main light emission. The assist material refers to a compound that accounts for a smaller mass proportion than the host among the compounds constituting the light-emitting layer and that assists the light emission of the guest. The assist material is also referred to as a second host. The host material can also be referred to as a first compound, and the assist material as a second compound.

When the organic compound according to this embodiment is used as a guest of the light-emitting layer, the concentration of the guest is preferably 0.01 mass % or more and 20 mass % or less, more preferably 0.1 mass % or more and 10 mass % or less, relative to the total mass of the light-emitting layer.

The light-emitting layer according to this embodiment contains the iridium complex and a first organic compound, and the first organic compound may be a compound that has a higher lowest excited singlet energy than the iridium complex. The first organic compound is also referred to as a host. The weight ratio of the host in the light-emitting layer may be larger than that of the iridium complex.

The light-emitting layer may also contain a second organic compound different from the first organic compound. The second organic compound may be a compound whose lowest excited triplet energy is lower than that of the first organic compound and higher than that of the iridium complex. The second organic compound is also referred to as an assistant. The weight ratio of the assistant in the light-emitting layer may be smaller than that of the host and smaller than that of the iridium complex.

The present inventors have conducted various studies and found that when the organic compound according to this embodiment is used as a host or a guest of a light-emitting layer, particularly, as a guest of a light-emitting layer, an element that outputs light with high efficiency and high luminance and has very high durability can be provided. This light-emitting layer may have a single-layer structure or a multilayer structure. The light-emitting layer may contain a light-emitting material having another emission color so as to emit light having a color mixed with red, which is the emission color of this embodiment. The multilayer structure refers to a state in which the light-emitting layer and another light-emitting layer are stacked on top of each other. In this case, the emission color of the organic light-emitting element is not limited to red. More specifically, the emission color may be white or an intermediate color. In the case of white, the other light-emitting layer emits light of a color other than red, that is, blue or green. The light-emitting layer is formed by vapor deposition or coating. Details thereof will be described in EXAMPLES given later.

The organometallic complex according to this embodiment can be used as a constituent material of an organic compound layer other than the light-emitting layer constituting the organic light-emitting element according to this embodiment. Specifically, the organometallic complex may be used as a constituent material of, for example, the electron transport layer, the electron injection layer, the hole transport layer, the hole injection layer, or the hole blocking layer. In this case, the emission color of the organic light-emitting element is not limited to red. More specifically, the emission color may be white or an intermediate color.

In addition to the organic compound according to this embodiment, known low-molecular-weight and high-molecular-weight hole injection compounds or hole transport compounds, compounds serving as hosts, luminescent compounds, electron injection compounds or electron transport compounds, and the like may optionally be used in combination. Examples of these compounds will be described below.

As hole injection and transport materials, materials that facilitate injection of holes from the anode and that have so high hole mobility that enables injected holes to be transported to the light-emitting layer are preferred. To reduce deterioration of film quality, such as crystallization, in the organic light-emitting element, materials having high glass-transition temperatures are preferred. Examples of low-molecular-weight and high-molecular-weight materials having hole injection and transport properties include triarylamine derivatives, arylcarbazole derivatives, phenylenediamine derivatives, stilbene derivatives, phthalocyanine derivatives, porphyrin derivatives, poly(vinylcarbazole), poly(thiophene), and other conductive polymers. These hole injection and transport materials are also suitable for use in the electron blocking layer. Non-limiting specific examples of compounds usable as hole injection and transport materials are shown below.

HT13
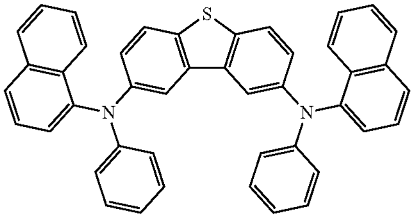
HT14
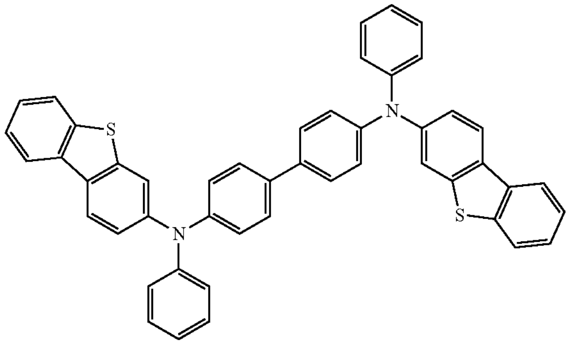
HT15
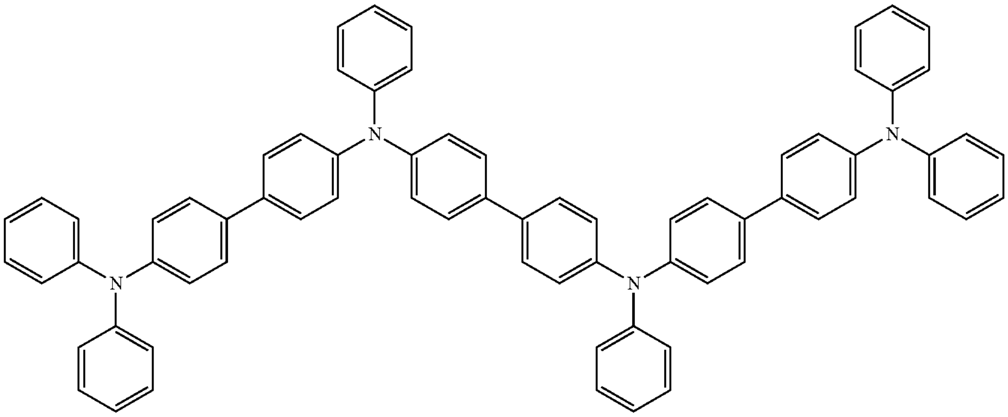
HT16
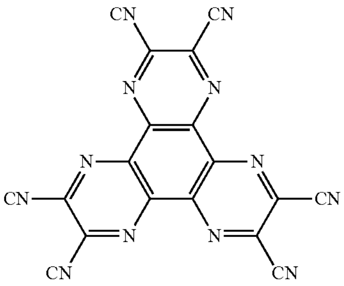
HT17
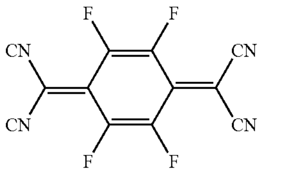
HT18
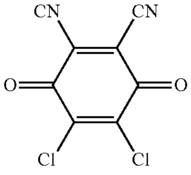
HT19
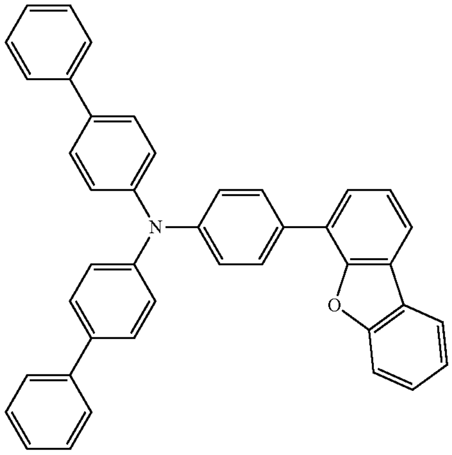

-continued

HT20

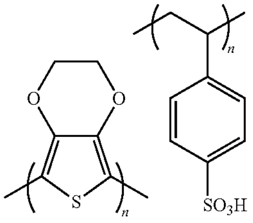

Examples of light-emitting materials mainly involved in the light-emitting function include, in addition to the organometallic complex represented by general formula (1), fused-ring compounds (e.g., fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinolato)aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

Non-limiting specific examples of compounds usable as light-emitting materials are shown below.

BD1

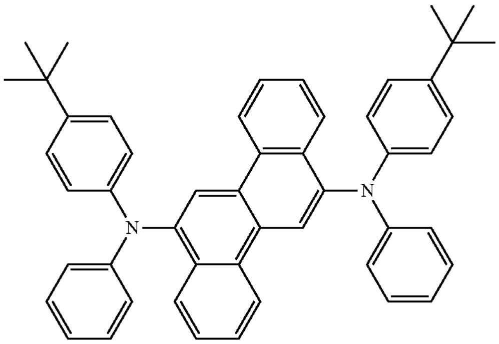

BD2

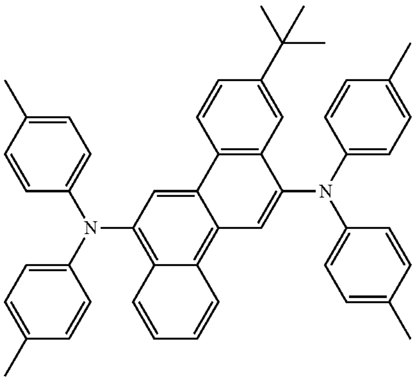

HT21

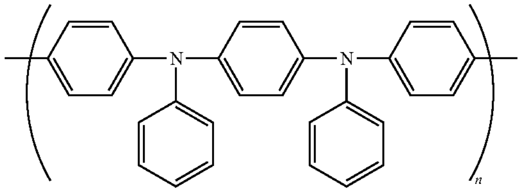

-continued

BD3

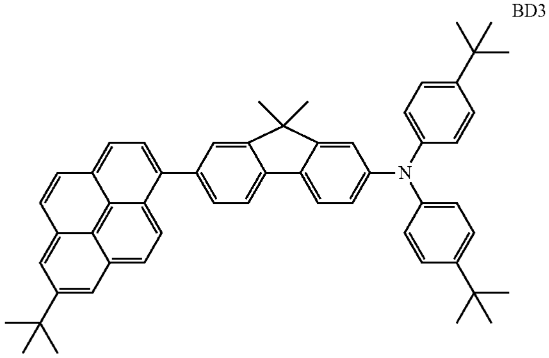

BD4

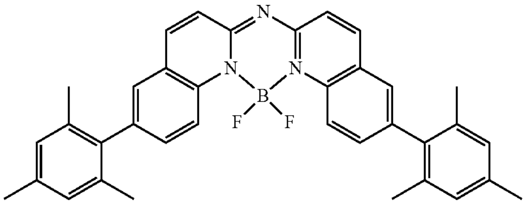

BD5

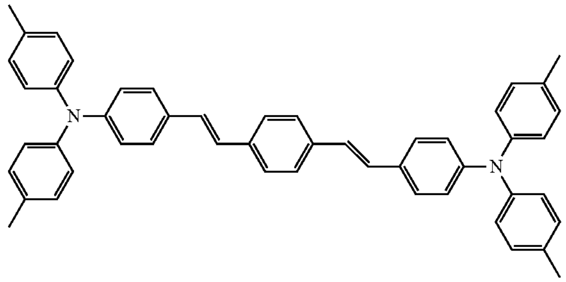

BD6

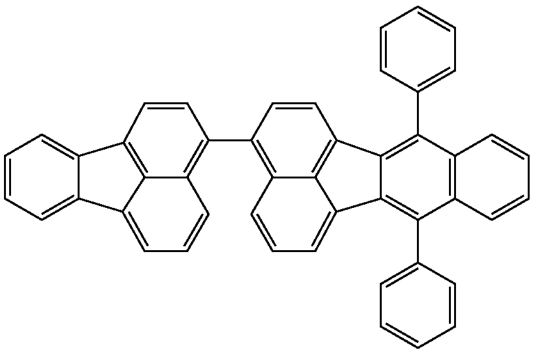

-continued
BD7
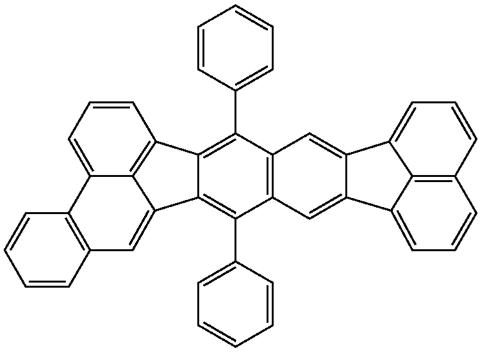
BD8
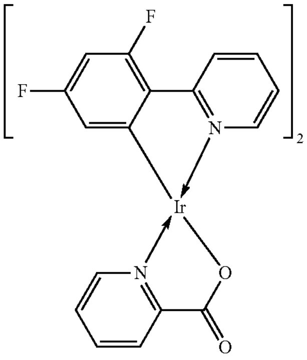
GD1
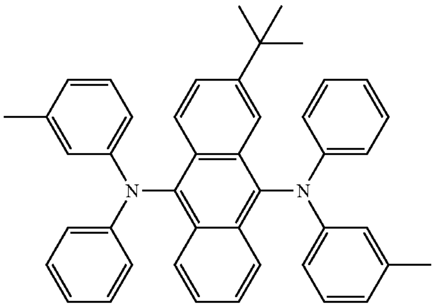
GD2
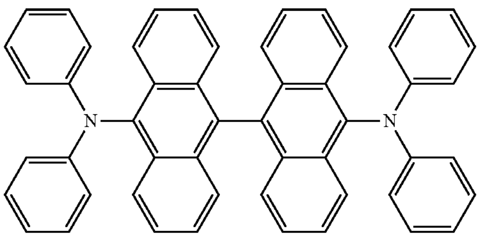
-continued
GD3
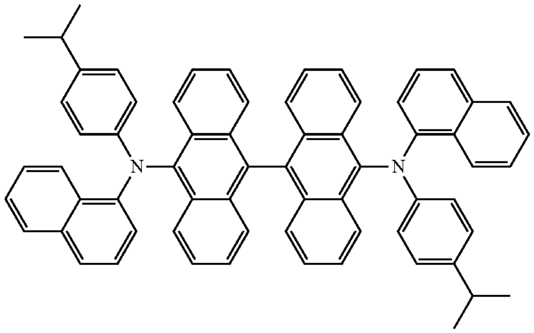
GD4
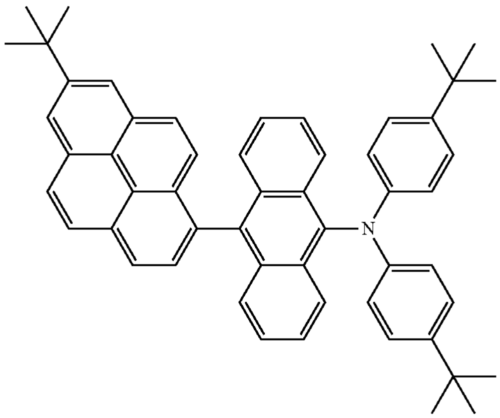
GD5
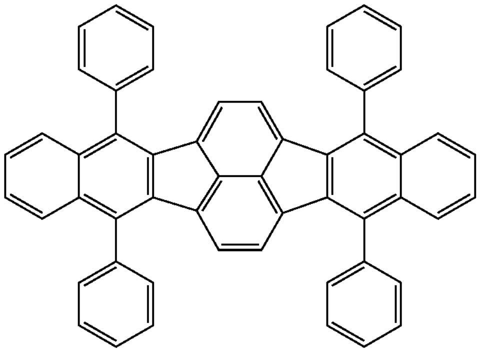
GD6
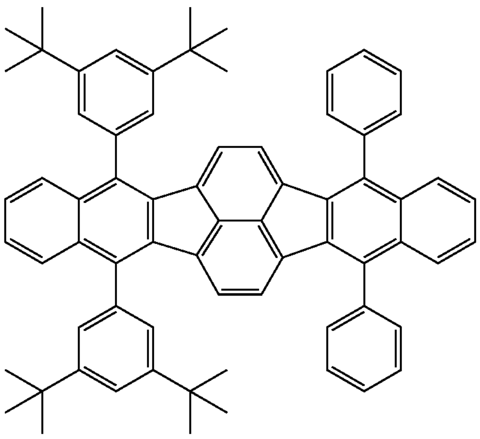

-continued
GD7
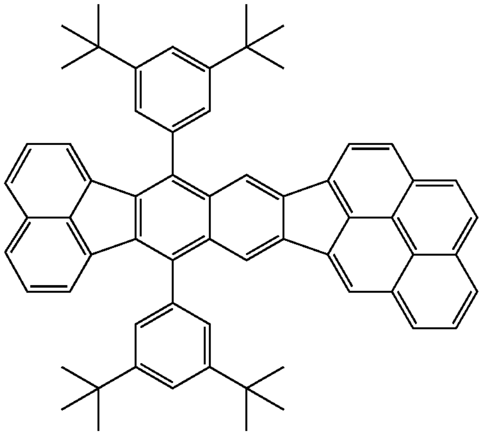
GD8
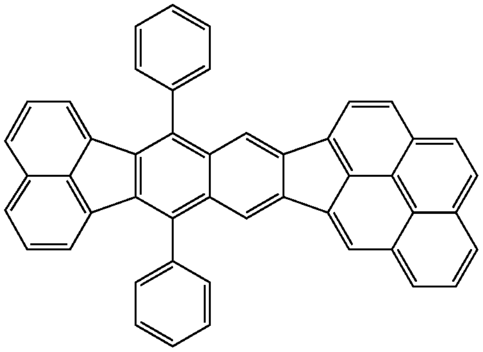
GD9
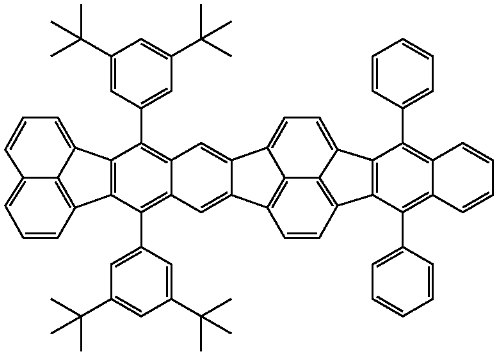
GD10
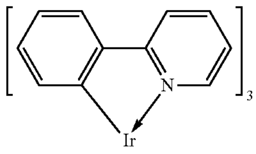
GD11
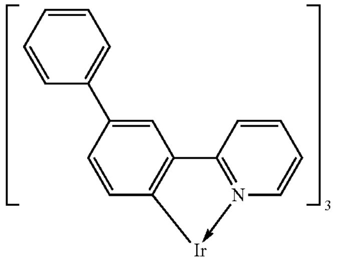
-continued
GD12
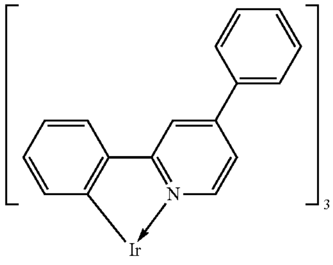
RD1
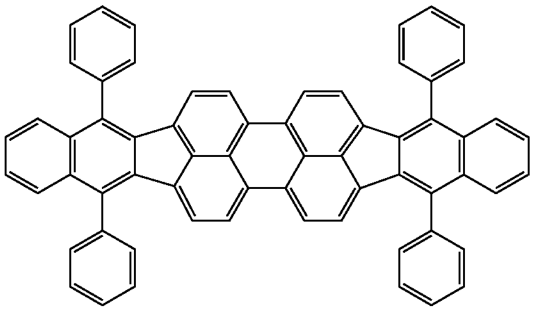
RD2
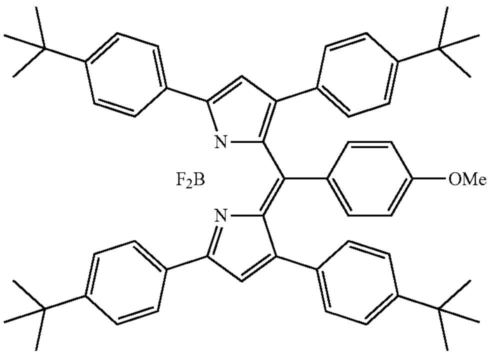
RD3
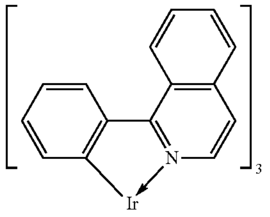
RD4
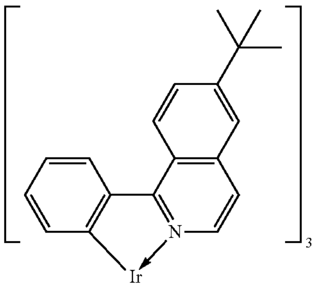

-continued

RD5

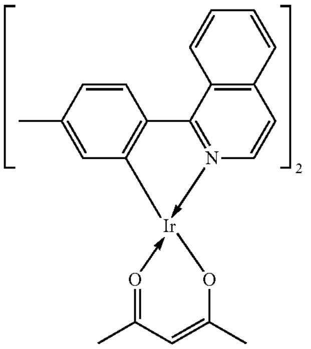

RD6

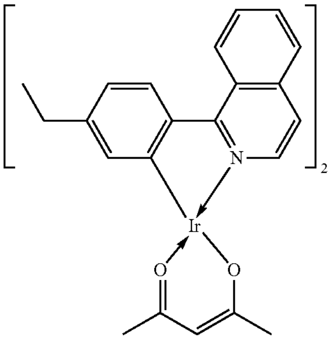

RD7

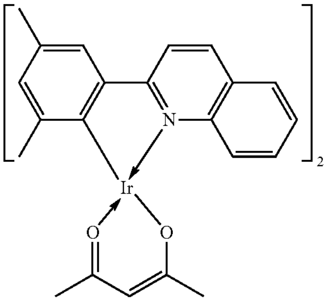

-continued

RD8

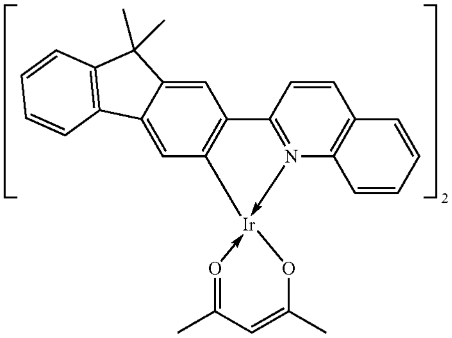

Examples of light-emitting-layer hosts and light emission assist materials contained in the light-emitting layer include aromatic hydrocarbon compounds and derivatives thereof, carbazole derivatives, dibenzofuran derivatives, dibenzothiophene derivatives, organic aluminum complexes such as tris(8-quinolinolato)aluminum, and organic beryllium complexes.

An embodiment of the present invention is an ink composition containing the composition according to the present invention, a first organic compound, and a solvent. The first organic compound is preferably a compound that has a higher lowest excited triplet energy than the iridium complex represented by general formula (1). The first organic compound may be referred to as a host. When the host material is a polymer, the host material may be a block copolymer, a random copolymer, an alternating copolymer, a graft copolymer, or any other form.

Examples of the solvent include halogenated hydrocarbon solvents such as chloroform, dichloroethane, tetrachloroethane, chlorobenzene, and o-dichlorobenzene; ether solvents such as tetrahydrofuran and ethylene glycol dimethyl ether; aromatic hydrocarbon solvents such as toluene, xylene, and mesitylene; aliphatic hydrocarbon solvents such as normal heptane, iso-heptane, and methylcyclohexane; ketone solvents such as methyl ethyl ketone, 2-heptanone, and cyclohexanone; ester solvents such as ethyl acetate, butyl acetate, γ-butyrolactone, and γ-valerolactone; polyhydric alcohol solvents; alcohol solvents; sulfoxide solvents such as dimethylsulfoxide and sulfolane; and amide solvents such as N,N-dimethylformamide, N,N-dimethylacetamide, and 1-methyl-2-pyrrolidone. These organic solvents can be used alone or in combination of two or more. Of these, those having an appropriate evaporation rate, specifically, organic solvents having a boiling point of about 70° C. to 200° C. are preferably used because a thin film having a uniform thickness is easily provided.

The ink composition can be formed into a film by, for example, a spin coating method, a bar coating method, a slit coating method, an ink-jet method, a nozzle coating method, a casting method, or a gravure printing method.

Non-limiting specific examples of compounds usable as light-emitting-layer hosts or light emission assist materials contained in the light-emitting layer are shown below.

EM1
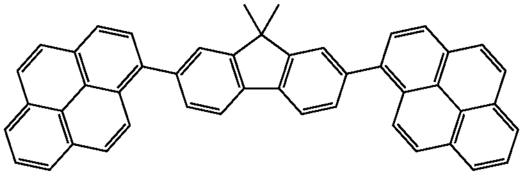
EM2
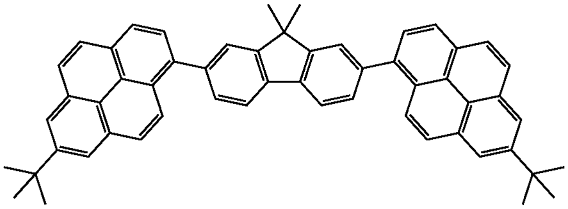
EM3
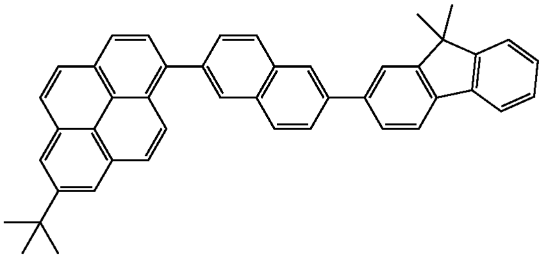
EM4
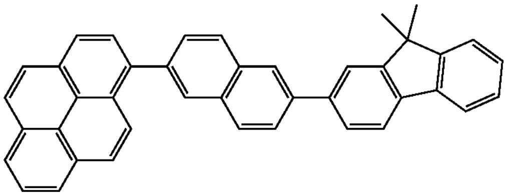
EM5
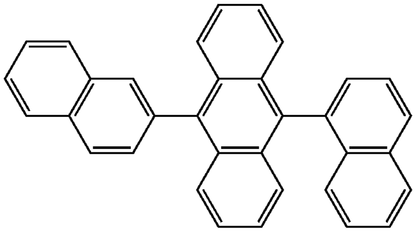
EM6
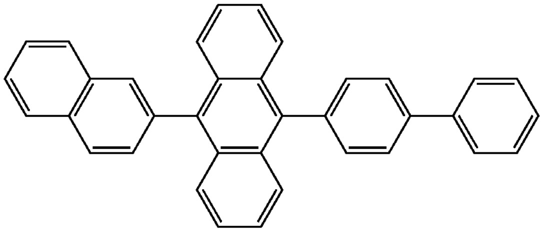
EM7
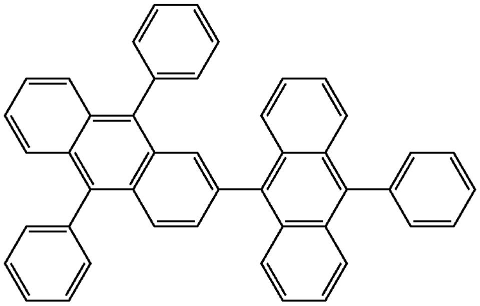
EM8
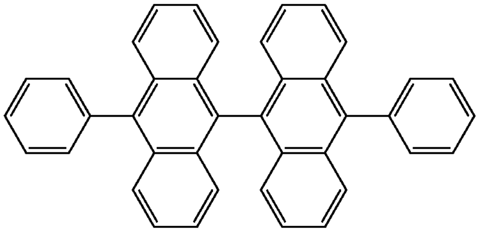
EM9
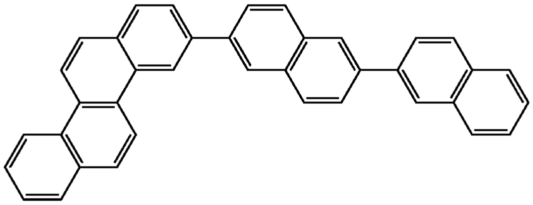
EM10
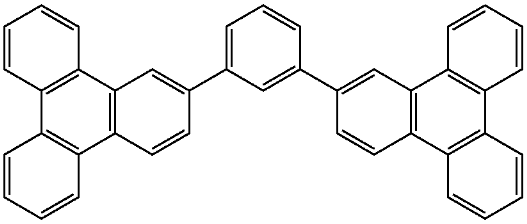
EM11
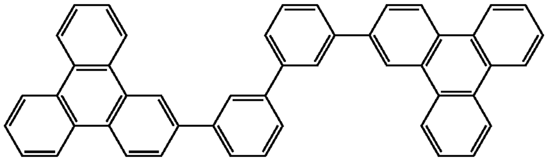
EM12
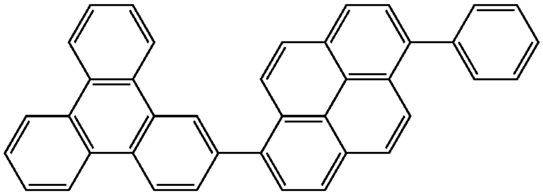

-continued
EM13
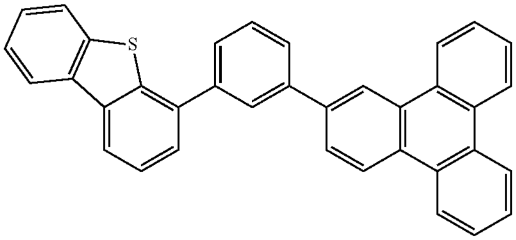
EM14
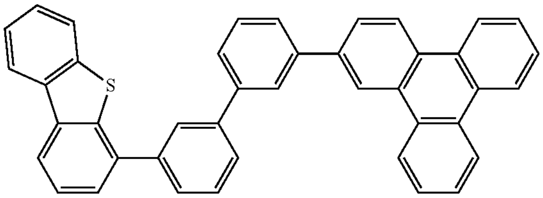
EM15
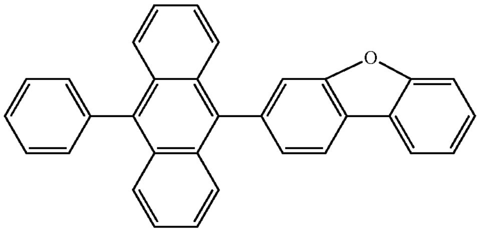
EM16
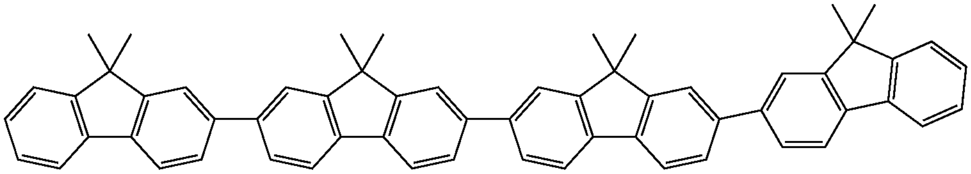
EM17
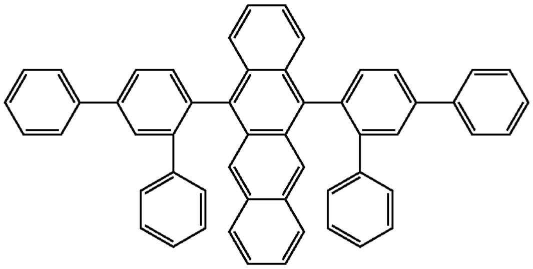
EM18
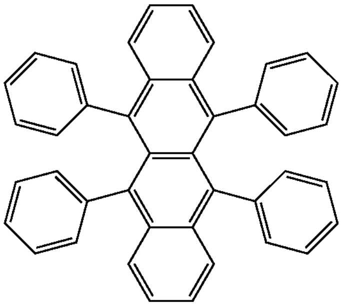
EM19
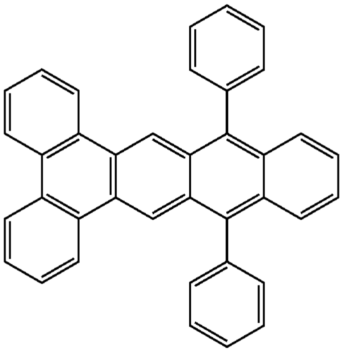
EM20
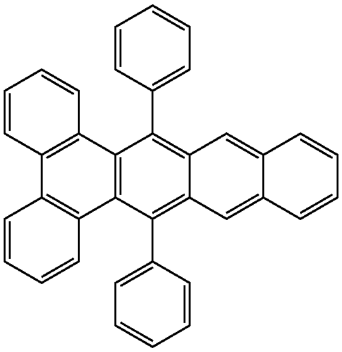

-continued
EM21
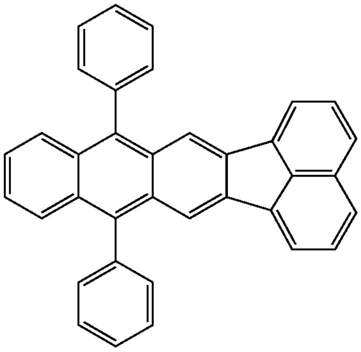
EM22
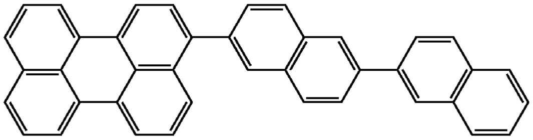
EM23
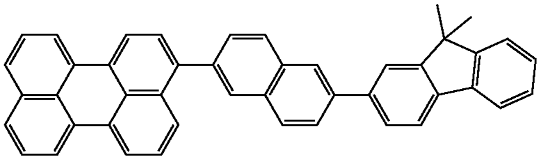
EM24
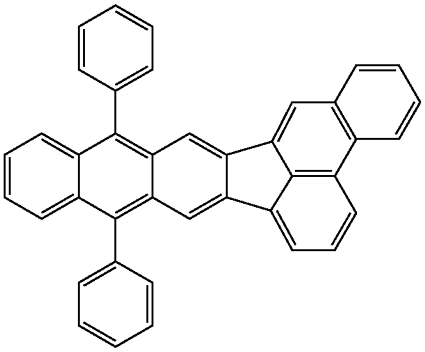
EM25
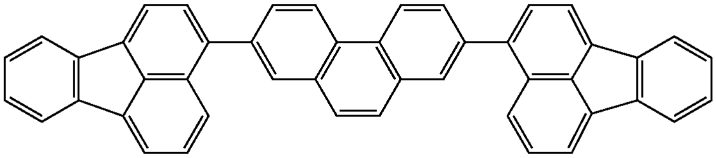
EM26
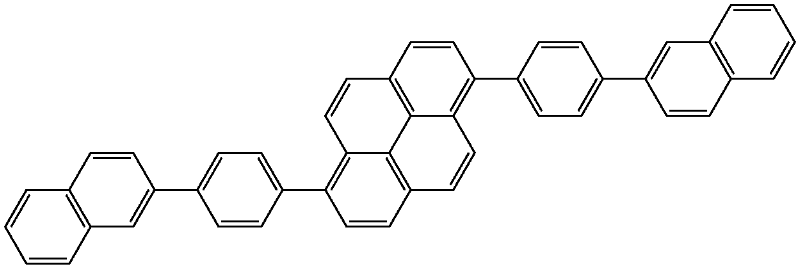
EM27
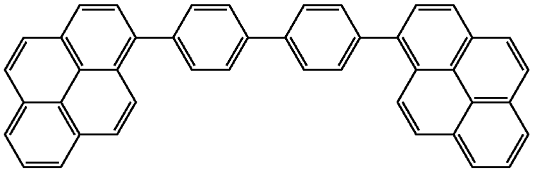
EM28
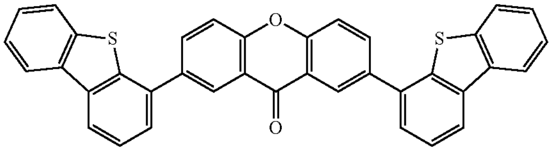

-continued
EM29
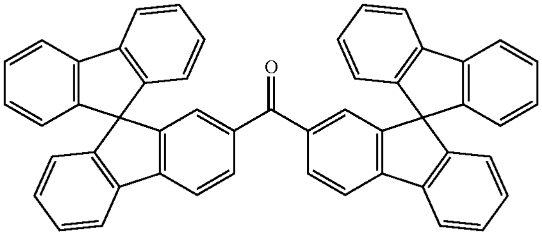
EM30
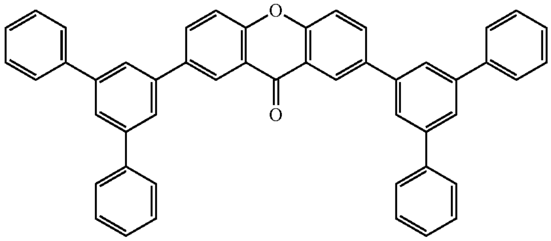
EM31
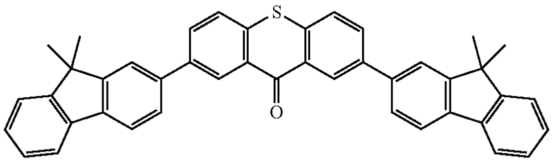
EM32
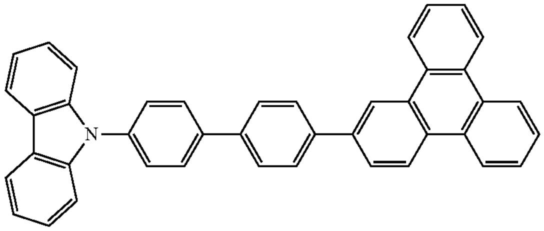
EM33
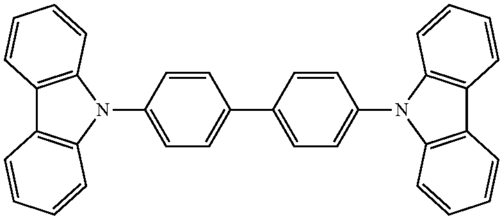
EM34
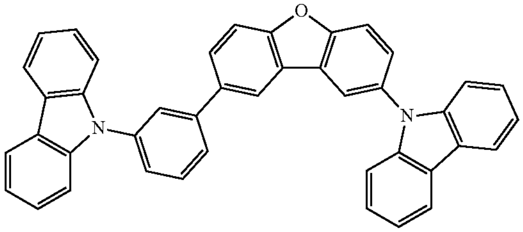
EM35
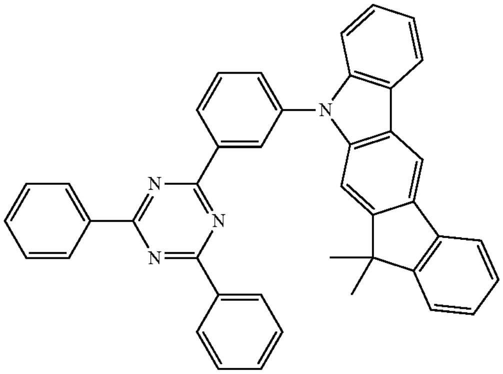
EM36
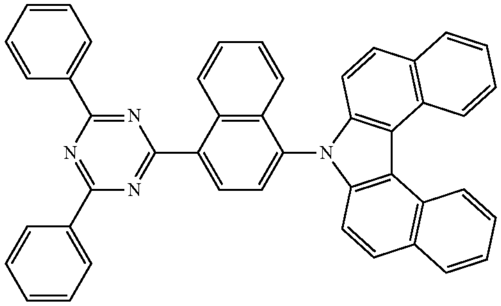
EM37
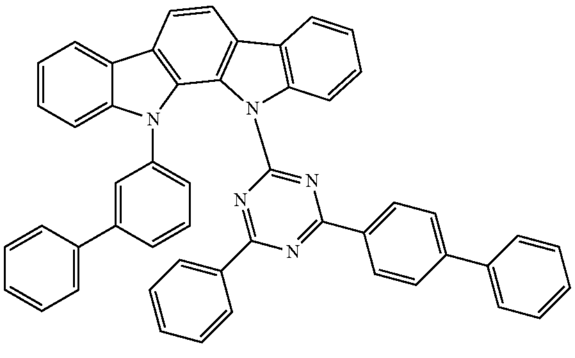
EM38
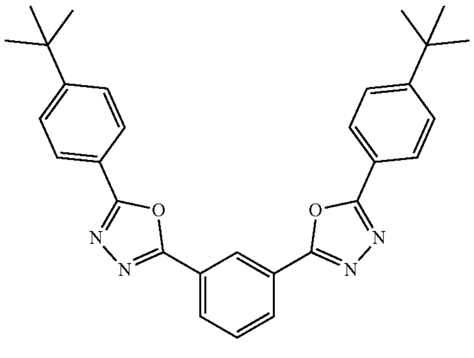
EM39
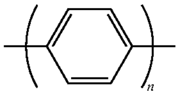
EM40
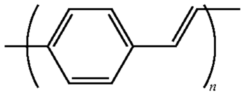

-continued
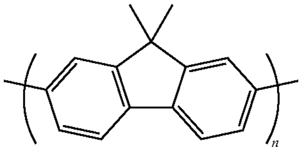
EM42
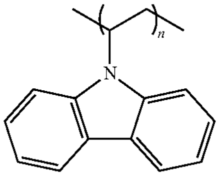
EM43
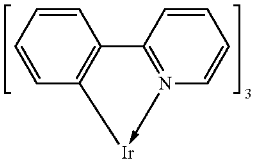
AD1
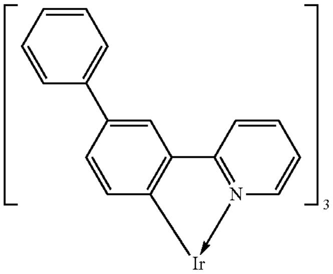
AD2
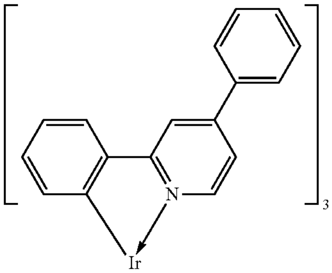
AD3
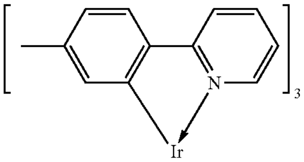
AD4
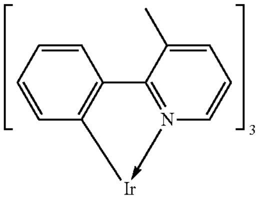
AD1
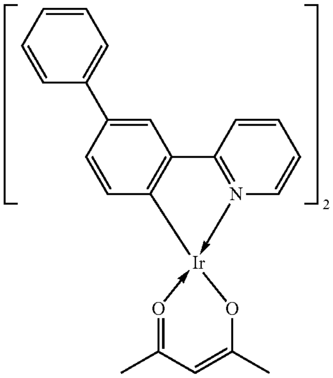
AD6
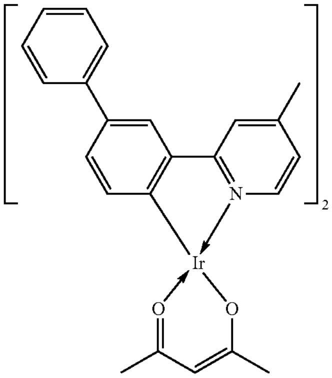
AD7
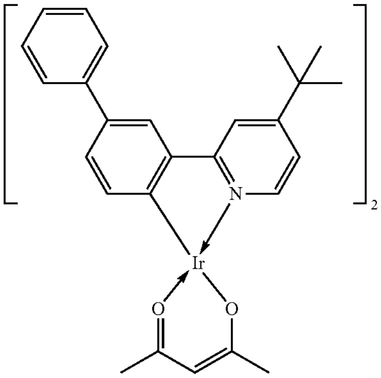
AD8

-continued

AD9

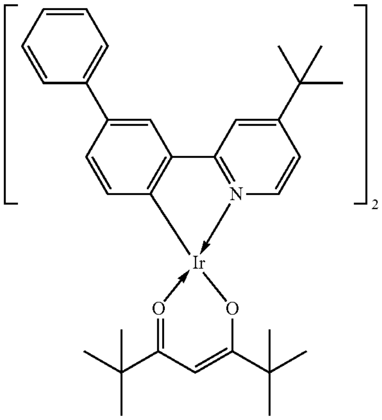

AD10

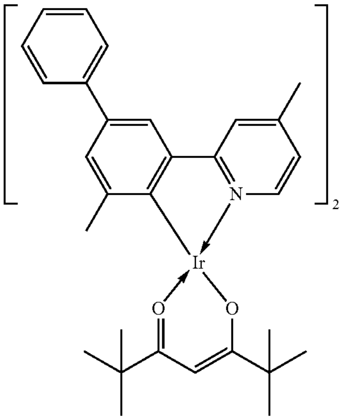

AD11

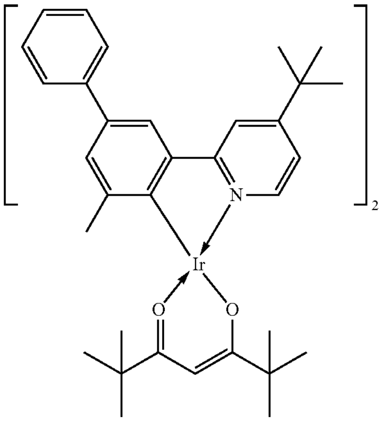

AD12

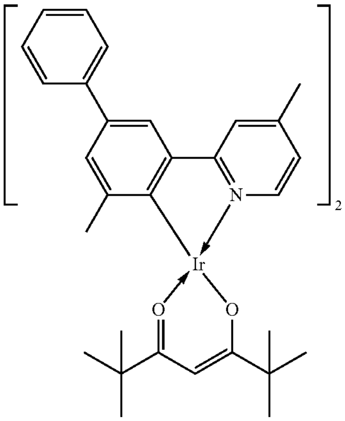

Any electron transport material capable of transporting electrons injected from the cathode to the light-emitting layer can be freely selected in consideration of, for example, the balance with the hole mobility of a hole transport material. Examples of materials capable of transporting electrons include oxadiazole derivatives, oxazole derivatives, pyrazine derivatives, triazole derivatives, triazine derivatives, quinoline derivatives, quinoxaline derivatives, phenanthroline derivatives, organic aluminum complexes, and fused-ring compounds (e.g., fluorene derivatives, naphthalene derivatives, chrysene derivatives, and anthracene derivatives). These electron transport materials are also suitable for use for the hole blocking layer. Non-limiting specific examples of compounds usable as electron transport materials are shown below.

ET1

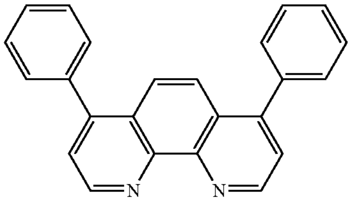

-continued

ET2

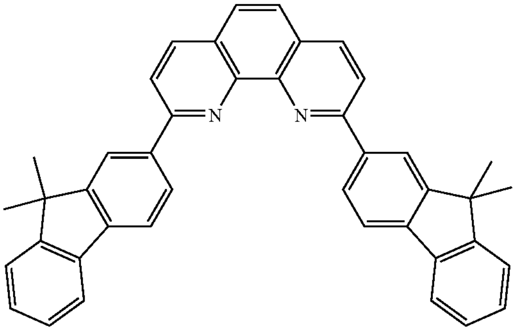

ET3

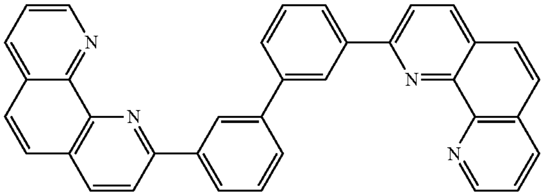

-continued
ET4
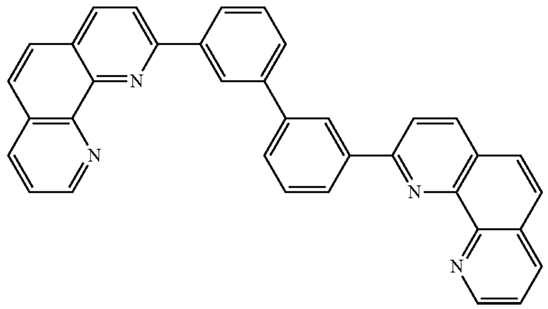
ET5
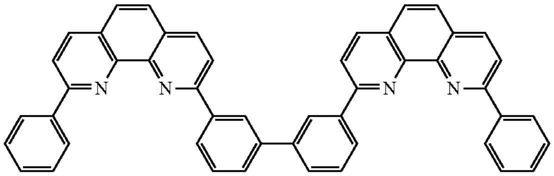
ET6
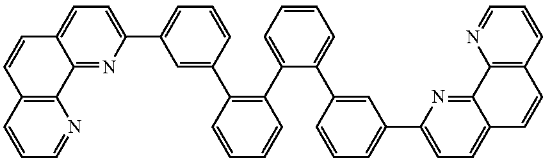
ET7
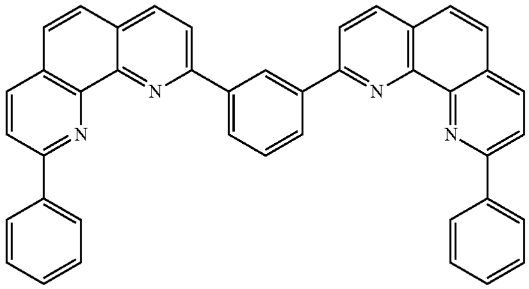
ET8
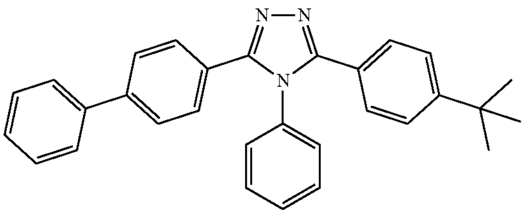
ET9
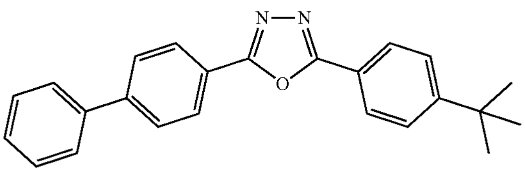
-continued
ET10
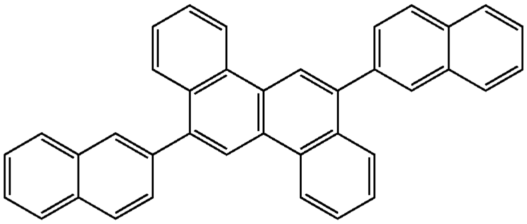
ET11
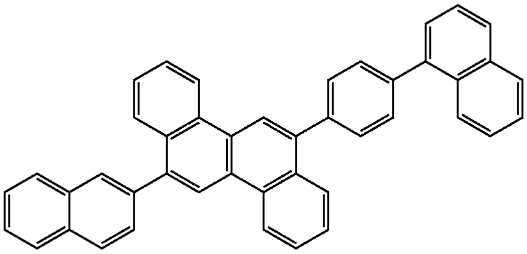
ET12
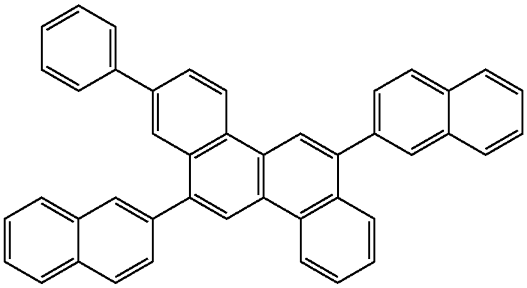
ET13
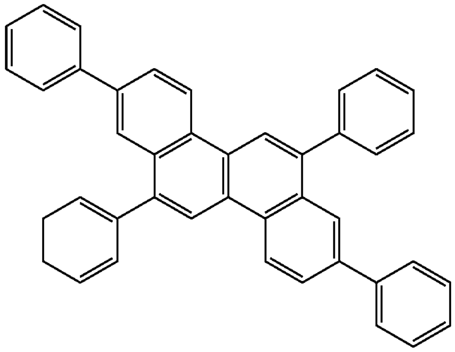
ET14
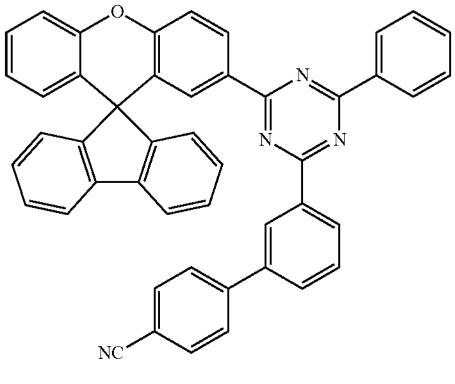

-continued
ET15
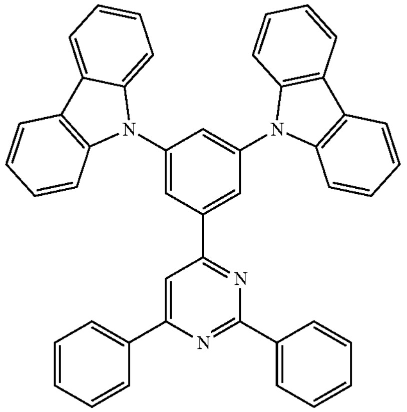
ET16
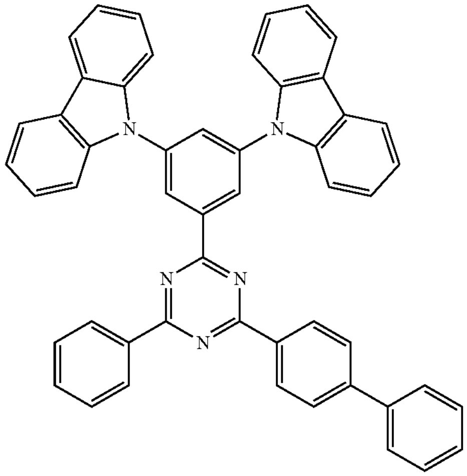
ET17
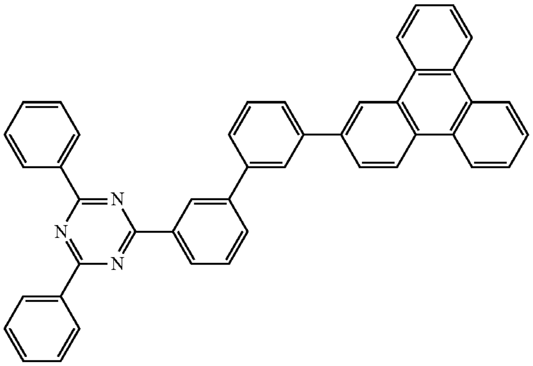
ET18
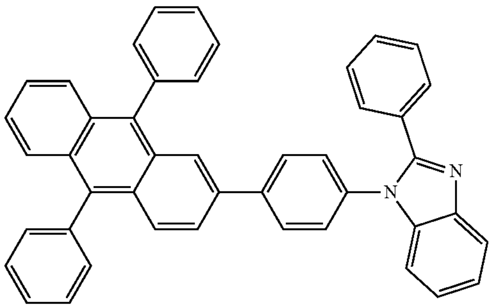
-continued
ET19
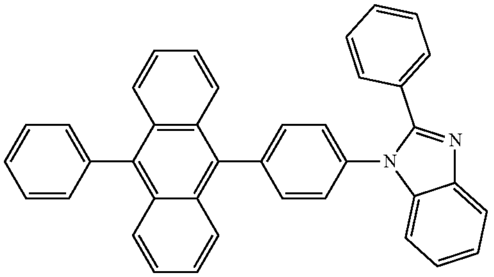
ET20
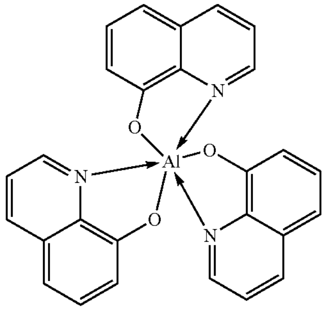
ET21
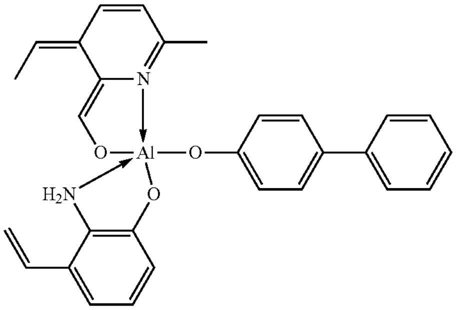
ET22
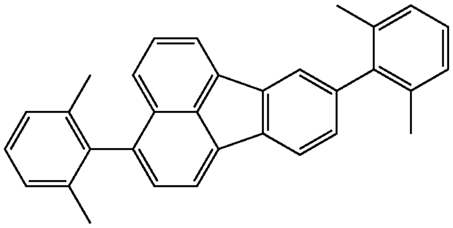
ET23
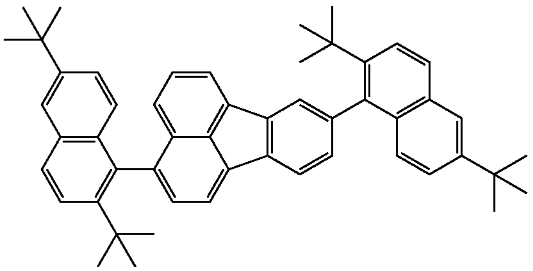

-continued

ET24

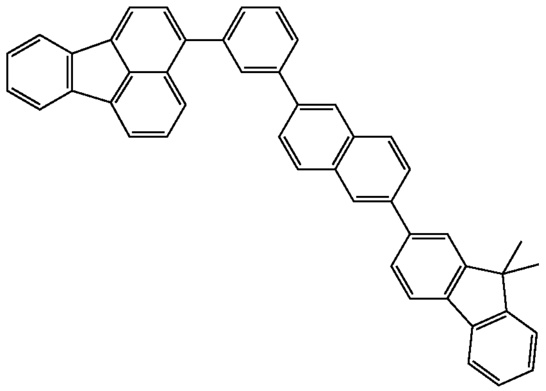

ET25

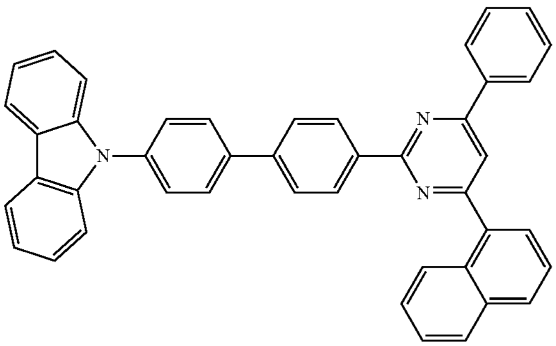

ET26

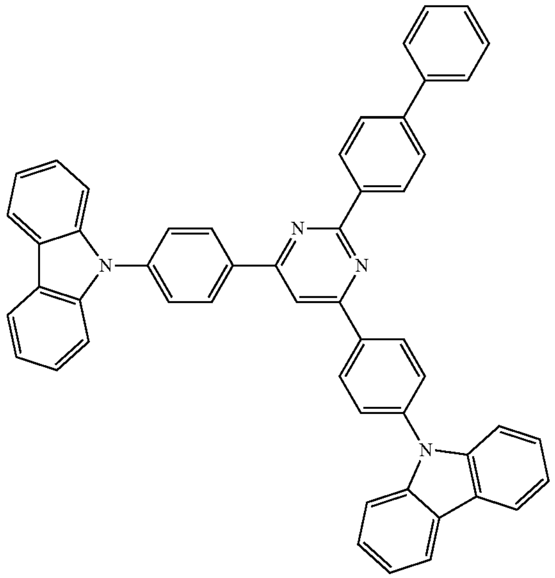

-continued

ET27

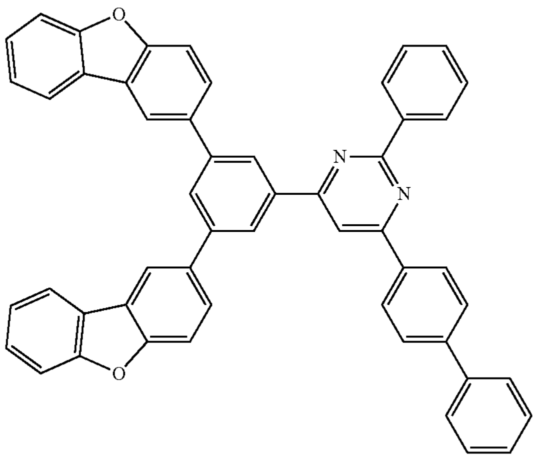

Hereinafter, constituent members other than the organic compound layer that constitute the organic light-emitting element according to this embodiment will be described. The organic light-emitting element may be provided by forming the first electrode, the organic compound layer, and the second electrode on a substrate. A protective layer, a color filter, and the like may be disposed on the second electrode. When the color filter is disposed, a planarization layer may be disposed between the protective layer and the color filter. The planarization layer may be composed of an acrylic resin or the like.

The substrate may be made of quartz, glass, silicon, resin, metal, or the like. A switching element such as a transistor and a wire may be disposed on the substrate, and an insulating layer may be disposed thereon. The insulating layer may be made of any material as long as contact holes can be formed in order to provide electrical connection between the anode and the wire and insulation from unconnected wires can be provided. For example, resins such as polyimide, silicon oxide, and silicon nitride can be used.

The constituent material for the anode preferably has as high a work function as possible. For example, elemental metals such as gold, platinum, silver, copper, nickel, palladium, cobalt, selenium, vanadium, and tungsten, mixtures containing these metals, alloys of these metals, and metal oxides such as tin oxide, zinc oxide, indium oxide, indium tin oxide (ITO), and indium zinc oxide can be used. Conductive polymers such as polyaniline, polypyrrole, and polythiophene can also be used. These electrode materials may be used alone or in combination of two or more. The anode may be composed of a single layer or a plurality of layers. When the anode is used as a reflection electrode, for example, chromium, aluminum, silver, titanium, tungsten, molybdenum, an alloy thereof, or a laminate thereof can be used. When the anode is used as a transparent electrode, for example, a transparent conductive layer made of an oxide such as indium tin oxide (ITO) or indium zinc oxide can be used, but these materials are non-limiting examples. Photolithography can be used for anode formation.

The constituent material for the cathode preferably has a low work function. Examples of such materials include alkali metals such as lithium; alkaline earth metals such as calcium; elemental metals such as aluminum, titanium, manganese, silver, lead, and chromium; and mixtures containing these elemental metals. Alloys of these elemental metals can also be used. For example, magnesium-silver, aluminum-lithium, aluminum-magnesium, silver-copper, and zinc-silver can be used. Metal oxides such as indium tin oxide (ITO) can also be used. These electrode materials may be used alone or in combination of two or more. The cathode may be composed of a single layer or a plurality of layers. In particular, silver is preferably used, and a silver alloy is more preferred to suppress aggregation of silver. As long as aggregation of silver can be suppressed, the content ratio in the alloy is not limited, and may be, for example, 1:1.

The cathode is not particularly limited, and may be formed as a conductive oxide layer of ITO or the like to provide a top-emission element or may be formed as a reflection electrode of aluminum (Al) or the like to provide a bottom-emission element. The cathode may be formed by any method. For example, DC and AC sputtering methods are preferably used because these methods provide good film coverage and readily reduce resistance.

After the cathode is formed, a protective layer may be disposed. For example, by bonding a glass plate provided with a moisture absorbent to the cathode, permeation of water and the like into the organic compound layer can be suppressed, and the occurrence of a display failure can be suppressed. In another embodiment, a passivation film made of silicon nitride or the like may be disposed on the cathode to suppress permeation of water and the like into the organic compound layer. For example, the protective layer may be formed in such a manner that after the formation of the cathode, the resultant is conveyed to another chamber without breaking the vacuum, and a silicon nitride film having a thickness of 2 μm is formed by CVD. After the film formation by CVD, atomic layer deposition (ALD) may be performed to form a protective layer.

Color filters may be disposed on pixels. For example, color filters sized to fit pixels may be disposed on another substrate and bonded to a substrate disposed on the organic light-emitting element. Alternatively, color filters may be patterned by photolithography on a protective layer made of silicon oxide or the like.

The organic compound layers (e.g., the hole injection layer, the hole transport layer, the electron blocking layer, the light-emitting layer, the hole blocking layer, the electron transport layer, and the electron injection layer) constituting the organic light-emitting element according to this embodiment are formed by any of the following methods. Specifically, a dry process such as vacuum deposition, ion plating, sputtering, or plasma deposition can be used to form the organic compound layers. Instead of the dry process, a wet process in which a solution in an appropriate solvent is applied by a known coating method (e.g., spin coating, dipping, casting, the LB technique, or an ink jet method) to form a layer can also be used. When the layers are formed by, for example, vacuum deposition or solution coating, the layers are unlikely to undergo crystallization or the like and are highly stable over time. When a coating method is used for film formation, an appropriate binder resin can be used in combination to form a film. Examples of the binder resin include, but are not limited to, polyvinylcarbazole resins, polycarbonate resins, polyester resins, ABS resins, acrylic resins, polyimide resins, phenol resins, epoxy resins, silicone resins, and urea resins. The binder resins may be used alone as a homopolymer or copolymer or may be used as a mixture of two or more. In addition, known additives such as plasticizers, antioxidants, and UV absorbers may optionally be used in combination.

Device and Apparatus Including Organic Light-Emitting Element

The organic light-emitting element according to this embodiment can be used as a constituent member of a display device or an illumination apparatus. Other applications include an exposure light source in an electrophotographic image-forming apparatus, a backlight in a liquid crystal display, and a light-emitting apparatus including a white light source with a color filter.

The display device may be an image information processor that includes an image input unit to which image information from an area CCD, a linear CCD, a memory card, or the like is input, includes an information-processing unit that processes the input information, and displays the input image on a display unit. The display unit of an image pickup device or an ink-jet printer may have a touch panel function. The touch panel function may be activated by any system, such as an infrared system, an electrostatic capacitive system, a resistive film system, or an electromagnetic induction system. The display device may also be used in a display unit of a multifunctional printer.

The use of a device including the organic light-emitting element according to this embodiment enables a stable display with good image quality over a long period of time.

Display Device

A display device according to this embodiment includes a plurality of pixels, and at least one of the pixels includes the organic light-emitting element according to this embodiment. The pixels include the organic light-emitting element according to this embodiment and an active element. The display device may be used as a display unit of an image display apparatus including an input unit for inputting image information and the display unit for outputting an image.

Figure 1B:
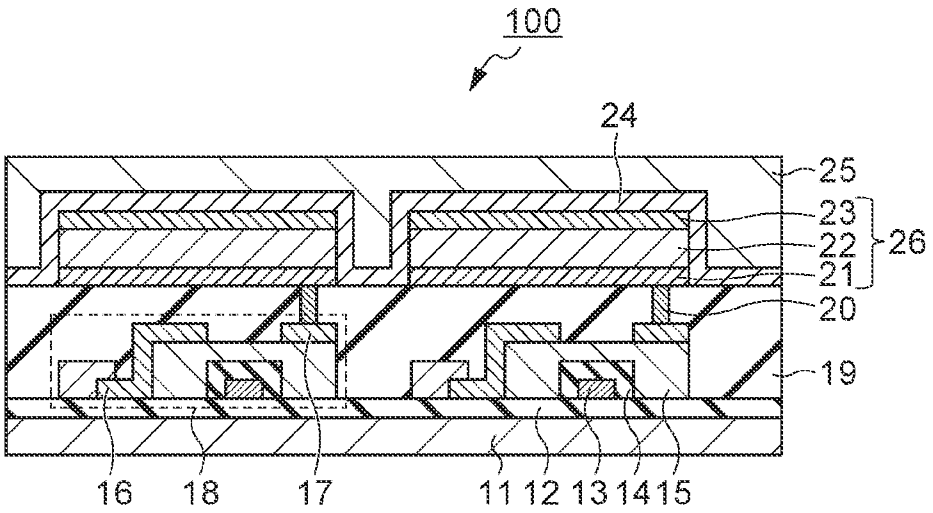
FIG. 1B is a schematic sectional view of an example of a display device including an organic light-emitting element according to an embodiment of the present invention.

FIG. 1A and FIG. 1B show schematic sectional views of examples of the display device according to this embodiment.

FIG. 1A is a schematic sectional view of an example of a pixel constituting the display device according to this embodiment. The pixel includes subpixels 10. The subpixels are divided into 10R, 10G, and 10B according to their light emission. The emission color may be distinguished on the basis of the wavelength of light emitted from a light-emitting layer, or light emitted from the subpixels may undergo selective transmission or color conversion through a color filter or the like. Each subpixel includes, on an interlayer insulating layer 1, a reflective electrode 2 serving as a first electrode, an insulating layer 3 that covers the edge of the reflective electrode 2, an organic compound layer 4 that covers the first electrode and the insulating layer, a transparent electrode 5, a protective layer 6, and a color filter 7.

The interlayer insulating layer 1 may include a transistor and a capacitor element below or inside the interlayer insulating layer 1. The transistor and the first electrode may be electrically connected to each other through a contact hole (not illustrated) or the like.

The insulating layer 3 is also referred to as a bank or a pixel-separating film. The insulating layer 3 is disposed so as to cover the edge of the first electrode and surround the first electrode. A portion in which the insulating layer is not disposed is in contact with the organic compound layer 4 and serves as a light-emitting region.

The organic compound layer 4 includes a hole injection layer 41, a hole transport layer 42, a first light-emitting layer 43, a second light-emitting layer 44, and an electron transport layer 45.

The second electrode 5 may be a transparent electrode, a reflective electrode, or a semitransparent electrode.

The protective layer 6 reduces permeation of water into the organic compound layer. Although the protective layer is illustrated as a single layer, it may be constituted by a plurality of layers. The layers may be constituted by an inorganic compound layer and an organic compound layer.

The color filter 7 is divided into 7R, 7G, and 7B according to their color. The color filter may be formed on a planarizing film (not illustrated). A resin protective layer (not illustrated) may be disposed on the color filter. The color filter may be formed on the protective layer 6. The color filter may be bonded after being formed on a counter substrate such as a glass substrate.

FIG. 1B is a schematic sectional view illustrating an example of a display device including an organic light-emitting element and a transistor connected to the organic light-emitting element. An organic light-emitting element 26 includes an anode 21, an organic compound layer 22, and a cathode 23. The transistor is an example of an active element. The transistor may be a thin film transistor (TFT).

A display device 100 in FIG. 1B includes a substrate 11 made of, for example, glass or silicon and an insulating layer 12 disposed on the substrate. An active element 18 such as a TFT is disposed on the insulating layer, and a gate electrode 13, a gate insulating film 14, and a semiconductor layer 15 of the active element are disposed. The TFT 18 also includes the semiconductor layer 15, a drain electrode 16, and a source electrode 17. An insulating film 19 is disposed over the TFT 18. The anode 21 constituting the organic light-emitting element and the source electrode 17 are connected to each other through a contact hole 20 extending through the insulating film.

The electrodes (anode and cathode) included in the organic light-emitting element 26 and the electrodes (source electrode and drain electrode) included in the TFT need not necessarily be electrically connected to each other in the manner illustrated in FIG. 1B. It is only required that either the anode or the cathode be electrically connected to either the source electrode or the drain electrode of the TFT. TFT refers to a thin-film transistor.

Although the organic compound layer is illustrated as a single layer in the display device 100 in FIG. 1B, the organic compound layer 22 may be composed of multiple layers. A first protective layer 24 and a second protective layer 25 for reducing deterioration of the organic light-emitting element are disposed over the cathode 23.

Although a transistor is used as a switching element in the display device 100 in FIG. 1B, another switching element may be used instead.

The transistor used in the display device 100 in FIG. 1B may not only be a transistor obtained using a single-crystal silicon wafer but also a thin-film transistor including a substrate and an active layer on an insulating surface of the substrate. The active layer may be made of, for example, single-crystal silicon, non-single-crystal silicon such as amorphous silicon or microcrystalline silicon, or a non-single-crystal oxide semiconductor such as indium zinc oxide or indium gallium zinc oxide. The thin-film transistor is also referred to as a TFT element.

The transistor included in the display device 100 in FIG. 1B may be formed in a substrate such as a Si substrate. The phrase "formed in a substrate" means producing a transistor by processing a substrate itself, such as a Si substrate. That is, having a transistor in a substrate can also mean that the substrate and the transistor are integrally formed.

The organic light-emitting element according to this embodiment has an emission luminance that is controlled by a TFT, which is an example of a switching element. Disposing a plurality of organic light-emitting elements in a screen enables a display of an image with different emission luminances. The switching element according to this embodiment need not necessarily be a TFT and may be a transistor formed of low-temperature polysilicon or an active matrix driver formed on a substrate such as a Si substrate. The active matrix driver may also be formed in the substrate. Whether a transistor is provided in the substrate or a TFT is used is chosen depending on the size of the display unit. For example, when the display unit has a size of about 0.5 inches, the organic light-emitting element is preferably disposed on a Si substrate.

The display device may include a plurality of light-emitting elements. The light-emitting elements may include a drive circuit. The drive circuit may be an active matrix-type circuit which independently controls the light emission of a first light-emitting element and a second light-emitting element. The active matrix-type circuit may be voltage programmed or current programmed. The drive circuit includes a pixel circuit for each pixel. The pixel circuit may include a light-emitting element, a transistor that controls the emission luminance of the light-emitting element, a transistor that controls the timing of light emission, a capacitor that holds the gate voltage of the transistor that controls the emission luminance, and a transistor for providing a connection to GND not through the light-emitting element.

The interval between the light-emitting elements constituting a light-emitting apparatus may be 10 μm, 7 μm, or 5 μm or less.

Figure 2:
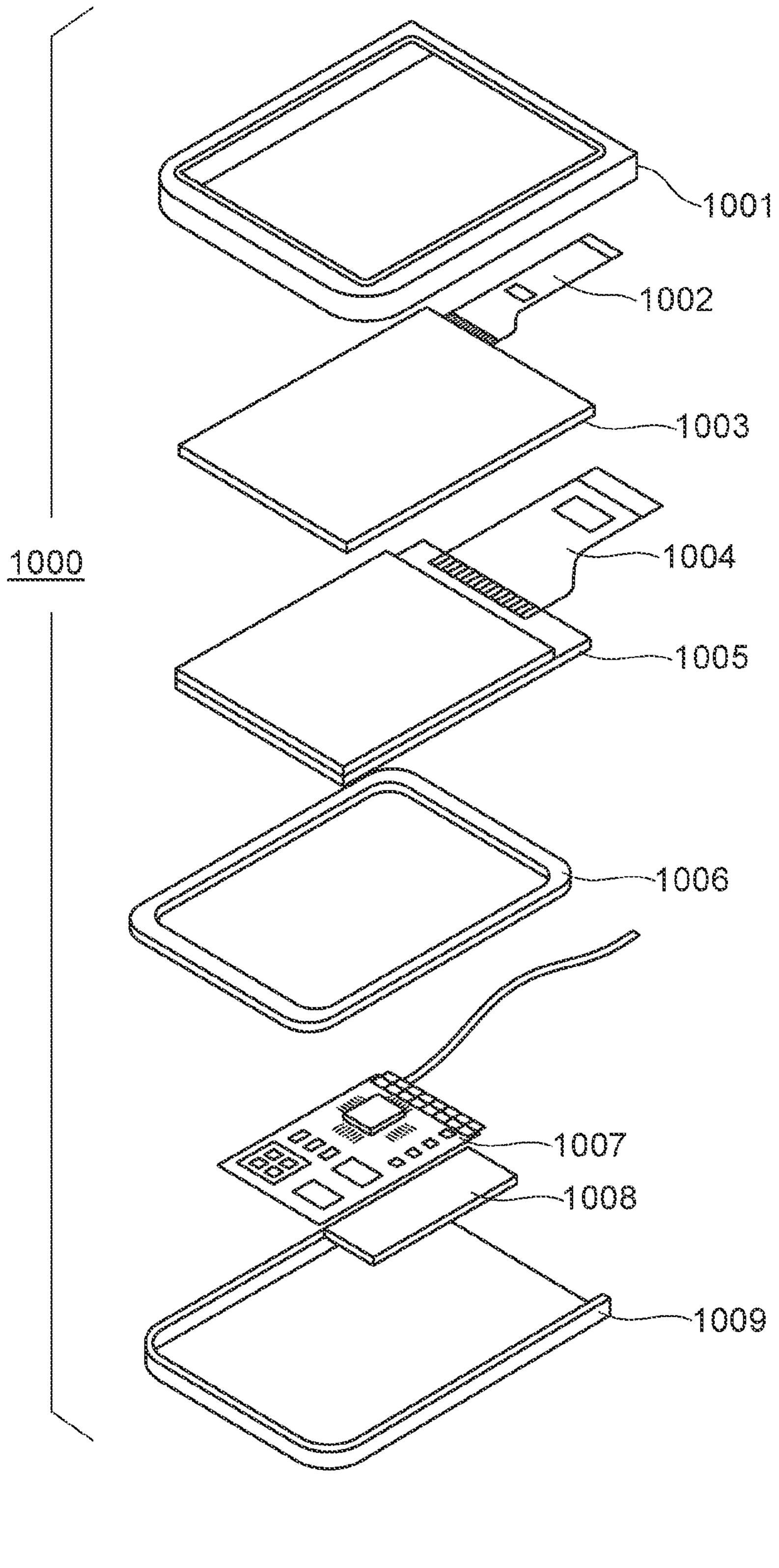
FIG. 2 is a schematic view showing an example of a display device according to an embodiment of the present invention.

FIG. 2 is a schematic view showing an example of a display device according to an exemplary embodiment. A display device 1000 may include an upper cover 1001, a lower cover 1009, and a touch panel 1003, a display panel 1005, a frame 1006, a circuit board 1007, and a battery 1008 disposed between the upper cover 1001 and the lower cover 1009. Flexible print circuits (FPCs) 1002 and 1004 are connected to the touch panel 1003 and the display panel 1005, respectively. The organic light-emitting element according to this embodiment may be used in the display panel 1005. A transistor is printed on the circuit board 1007. The battery 1008 may be omitted if the display device is not a mobile device. If the display device is a mobile device, the battery 1008 need not necessarily be disposed at this position.

Image Pickup Device

The display device according to this embodiment may be used as a display unit of a photoelectric conversion apparatus, such as an image pickup device, that includes an optical unit including a plurality of lenses and an image pickup element that receives light that has passed through the optical unit. The photoelectric conversion apparatus may include a display unit that displays information acquired by the image pickup element. The display unit may be exposed to the outside of the photoelectric conversion apparatus or disposed in a viewfinder. The photoelectric conversion apparatus may be a digital camera or a digital camcorder.

Figure 3A:
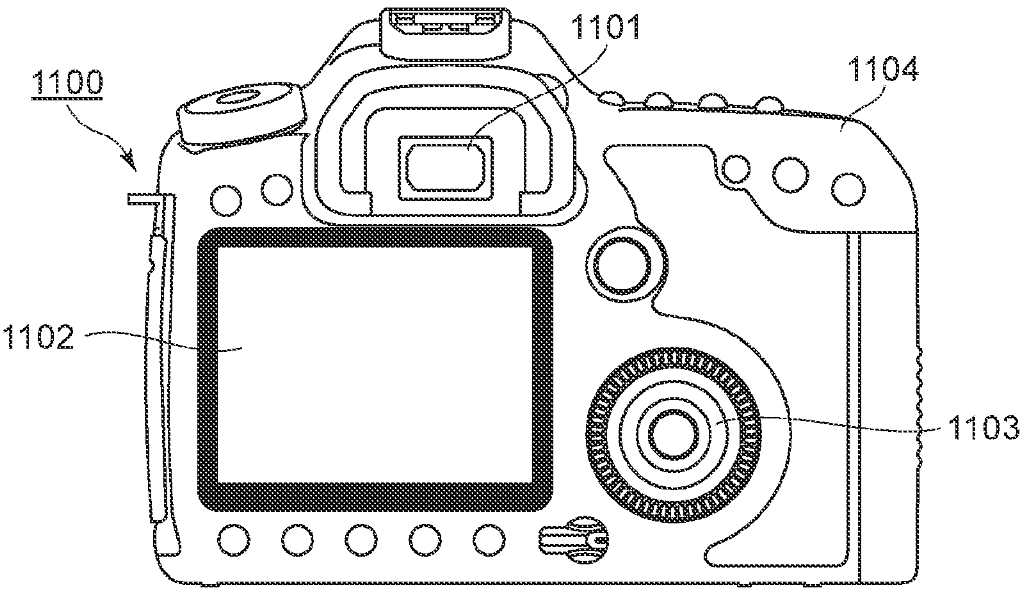
FIG. 3A is a schematic view showing an example of an image pickup device according to an embodiment of the present invention.

FIG. 3A is a schematic view showing an example of an image pickup device according to this embodiment. An image pickup device 1100 may include a viewfinder 1101, a rear display 1102, an operation unit 1103, and a housing 1104. The viewfinder 1101 may include the display device according to this embodiment. In this case, the display device may display not only an image to be captured but also environmental information, image capture instructions, and the like. The environmental information may be, for example, the intensity of external light, the direction of external light, the moving speed of a subject, and the possibility that the subject is hidden by an object. Since the timing appropriate for capturing an image is only a moment, the information is desirably displayed as quickly as possible. Thus, the display device including the organic light-emitting element of the present invention is preferably used. This is because the organic light-emitting element has a high response speed. The display device including the organic light-emitting element is more suitable for use in a device that requires speedy display than a liquid crystal display. The image pickup device 1100 includes an optical unit (not illustrated). The optical unit includes a plurality of lenses and focuses an image on the image pickup element accommodated in the housing 1104. By adjusting the relative positions of the plurality of lenses, the focal point can be adjusted. This operation can also be performed automatically.

Electronic Device

The display device according to this embodiment may be used in a display unit of an electronic device such as a mobile terminal. In this case, the display device may have both a display function and an operating function. Examples of the mobile terminal include cellular phones such as smart phones, tablets, and head mount displays.

Figure 3B:
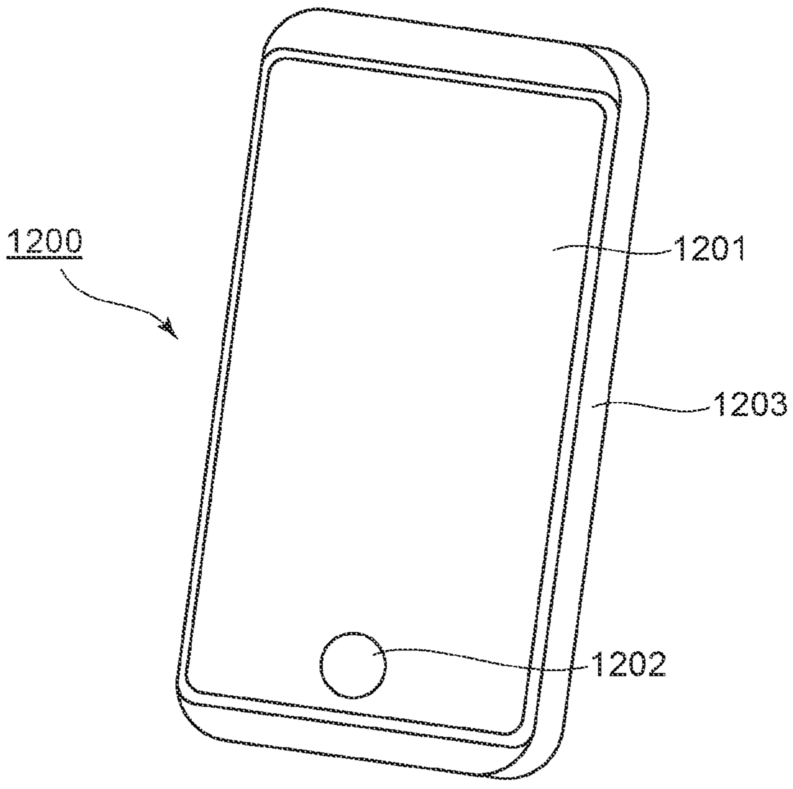
FIG. 3B is a schematic view showing an example of an electronic device according to an embodiment of the present invention.

FIG. 3B is an example of an electronic device including the display device according to this embodiment. A mobile device 1200 includes a display unit 1201, an operation unit 1202, and a housing 1203. The housing 1203 may include a circuit, a printed board including the circuit, a battery, and a communication unit. The operation unit 1202 may be a button or a touch-sensitive response unit. The operation unit may be a biometric recognition unit that, for example, releases a lock upon recognition of fingerprints. A mobile device including a communication unit can also be referred to as a communication device.

Figure 4A:
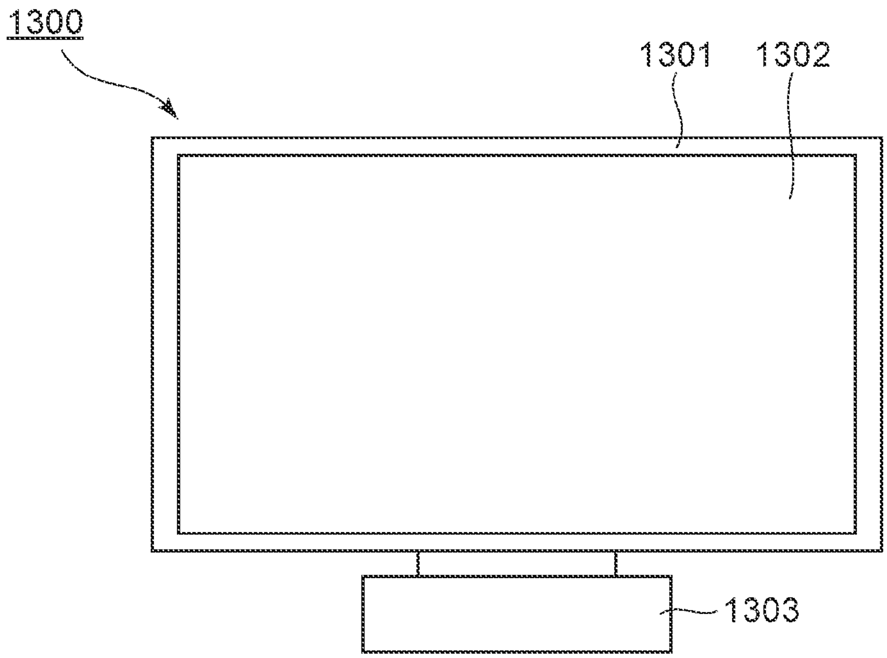
FIG. 4A is a schematic view showing an example of a display device according to an embodiment of the present invention.
Figure 4B:
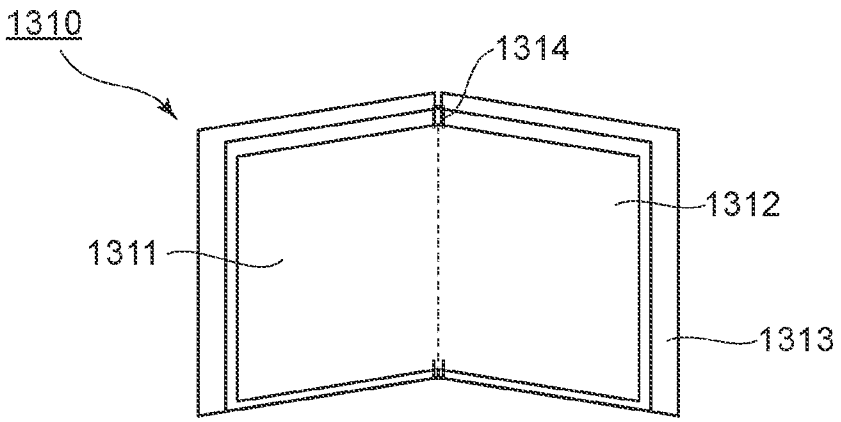
FIG. 4B is a schematic view showing an example of a foldable display device.

FIG. 4A and FIG. 4B show schematic views of examples of the display device according to this embodiment. FIG. 4A is a display device such as a television monitor or a PC monitor. A display device 1300 includes a frame 1301 and a display unit 1302. The organic light-emitting element according to this embodiment may be used in the display unit 1302. The display device 1300 includes a base 1303 that supports the frame 1301 and the display unit 1302. The base 1303 need not necessarily be in the form illustrated in FIG. 4A. The lower side of the frame 1301 may serve as a base. The frame 1301 and the display unit 1302 may be curved. The radius of curvature may be 5000 mm or more and 6000 mm or less.

A display device 1310 in FIG. 4B is configured to be folded and what is called a foldable display device. The display device 1310 includes a first display unit 1311, a second display unit 1312, a housing 1313, and a bending point 1314. The first display unit 1311 and the second display unit 1312 may include the organic light-emitting element according to this embodiment. The first display unit 1311 and the second display unit 1312 may be a seamless, monolithic display device. The first display unit 1311 and the second display unit 1312 can be divided by the bending point. The first display unit 1311 and the second display unit 1312 may display different images, or the first and second display units may together display a single image.

Illumination Apparatus

Figure 5A:
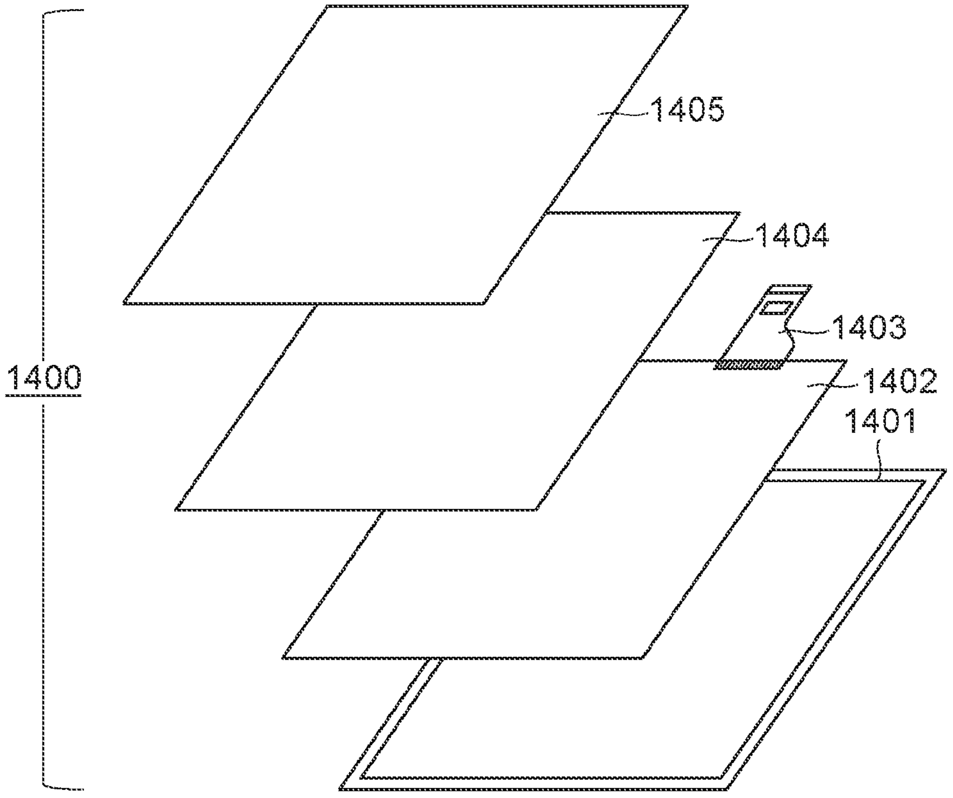
FIG. 5A is a schematic view showing an example of an illumination apparatus according to an embodiment of the present invention.

FIG. 5A is a schematic view showing an example of an illumination apparatus according to this embodiment. An illumination apparatus 1400 may include a housing 1401, a light source 1402, a circuit board 1403, an optical filter 1404, and a light diffusion unit 1405. The light source 1402 may include the organic light-emitting element according to this embodiment. The optical filter 1404 may be a film for improving the color rendering properties of the light source 1402. The light diffusion unit 1405 effectively diffuses light from the light source 1402 and enables the light to reach a wide region for, for example, lighting up. If necessary, a cover may be disposed at an outermost portion.

The illumination apparatus is, for example, an indoor illumination apparatus. The illumination apparatus may emit light of cool white, day white, or any other color from blue to red. The illumination apparatus may include a modulation circuit that modulates the light. The illumination apparatus may include the organic light-emitting element of the present invention and a power supply circuit connected thereto. The power supply circuit is a circuit that converts AC voltage to DC voltage. The illumination apparatus may include an inverter circuit. Cool white has a color temperature of 4200 K, and day white has a color temperature of 5000 K. The illumination apparatus may include a color filter. The illumination apparatus according to this embodiment may also include a heat dissipation unit. The heat dissipation unit dissipates heat in the apparatus to the outside and is formed of, for example, a metal with high specific heat or liquid silicon.

Moving Object

A moving object according to this embodiment may be, for example, an automobile, a ship, an aircraft, or a drone. The moving object may include a body and a lighting fixture disposed on the body. The lighting fixture may emit light for allowing the position of the body to be recognized. The lighting fixture includes the organic light-emitting element according to this embodiment.

Figure 5B:
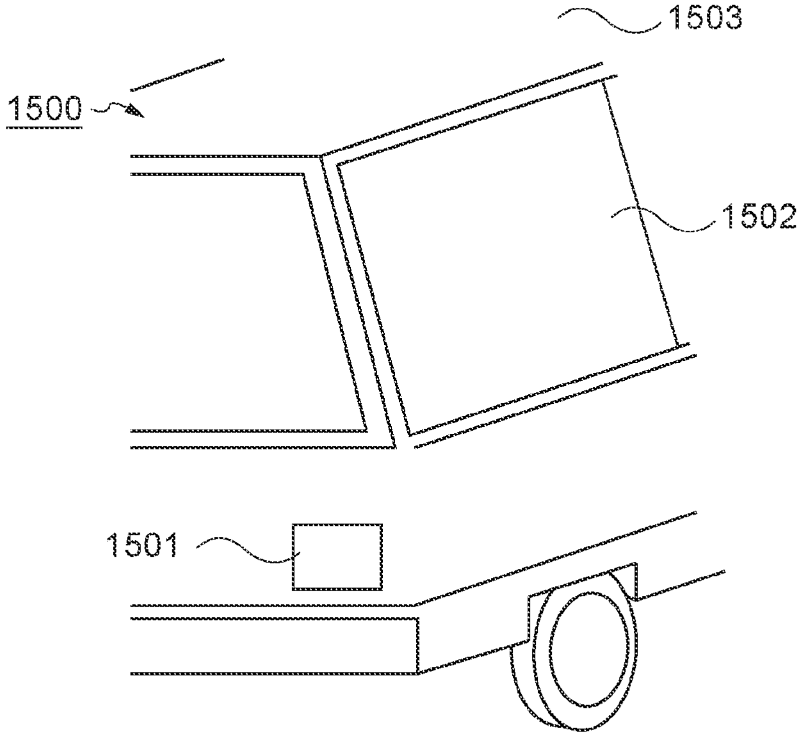
FIG. 5B is a schematic view showing an example of an automobile including a vehicle lighting fixture according to an embodiment of the present invention.

FIG. 5B is a schematic view showing an example of the moving object according to this embodiment and illustrates an automobile including a tail lamp, which is an example of a vehicle lighting fixture. An automobile 1500 serving as a body includes a tail lamp 1501, and the tail lamp 1501 may be configured to be turned on in response to, for example, brake operation. The tail lamp 1501 may include the organic light-emitting element according to this embodiment. The tail lamp 1501 may include a protective member that protects the organic light-emitting element. The protective member may be made of any material that has a certain degree of high strength and is transparent, but is preferably made of a polycarbonate or the like. The polycarbonate may be mixed with a furandicarboxylic acid derivative, an acrylonitrile derivative, or the like. The automobile 1500 may include a car body 1503 and a window 1502 attached thereto. The window 1502 may be a transparent display unless it is a window for checking the front and rear of the automobile 1500. The transparent display may include the organic light-emitting element according to this embodiment. In this case, components of the organic light-emitting element, such as electrodes, are formed of transparent materials.

Application examples of the display devices according to the above-described embodiments will be described with reference to FIG. 6A and FIG. 6B. The display devices can be applied to systems that can be worn as wearable devices such as smart glasses, HMDs, and smart contact lenses. An image pickup and display device used in such an application example includes an image pickup device that can photoelectrically convert visible light and a display device that can emit visible light.

Figure 6A:
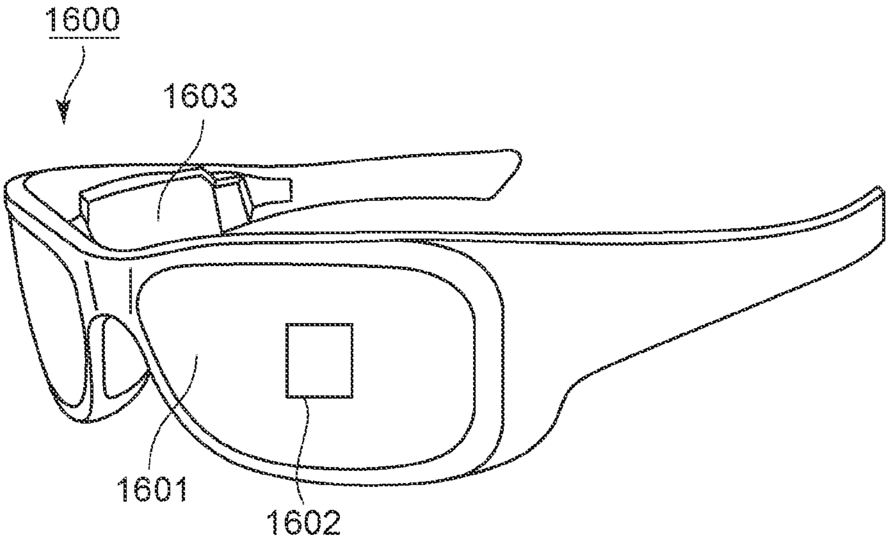
FIG. 6A is a schematic view showing an example of a wearable device according to an embodiment of the present invention.

FIG. 6A illustrates eyeglasses 1600 (smart glasses) according to one application example. An image pickup device 1602, such as a CMOS sensor or a SPAD, is disposed on the front side of a lens 1601 of the eyeglasses 1600. The display device according to any one of the above-described embodiments is provided on the rear side of the lens 1601.

The eyeglasses 1600 further include a controller 1603. The controller 1603 functions as a power source for supplying electricity to the image pickup device 1602 and the display device according to any of the embodiments. The controller 1603 controls the operation of the image pickup device 1602 and the display device. The lens 1601 is provided with an optical system for focusing light on the image pickup device 1602.

Figure 6B:
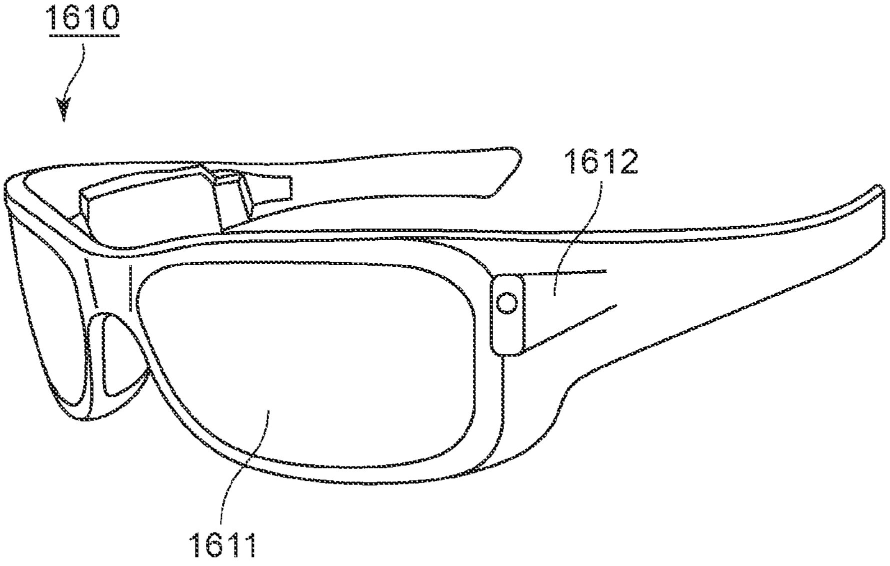
FIG. 6B is a schematic view of an example of a wearable device according to an embodiment of the present invention, the wearable device including an image pickup device.

FIG. 6B illustrates eyeglasses 1610 (smart glasses) according to one application example. The eyeglasses 1610 include a controller 1612, and the controller 1612 is equipped with an image pickup device corresponding to the image pickup device 1602 and a display device. A lens 1611 is provided with the image pickup device in the controller 1612 and an optical system for projecting light emitted from the display device, and an image is projected onto the lens 1611. The controller 1612 functions as a power source for supplying electricity to the image pickup device and the display device and also controls the operation of the image pickup device and the display device. The controller may include a gaze detection unit that detects the gaze of a wearer. The gaze may be detected using infrared radiation. An infrared light emission unit emits infrared light to an eyeball of a user gazing at a displayed image. The reflection of the emitted infrared light from the eyeball is detected by an image pickup unit including a light-receiving element, whereby a captured image of the eyeball is obtained. Due to the presence of a reduction unit that reduces light from the infrared light emission unit to the display unit in plan view, degradation of image quality is reduced.

The gaze of the user toward the displayed image is detected from the captured image of the eyeball obtained by infrared imaging. Any known method can be used for the gaze detection using the captured image of the eyeball. For example, a gaze detection method based on a Purkinje image formed by the reflection of irradiation light on a cornea can be used.

More specifically, a gaze detection process based on a pupil-corneal reflection method is performed. Using the pupil-corneal reflection method, a gaze vector representing the direction (rotation angle) of the eyeball is calculated on the basis of a pupil image and a Purkinje image included in the captured image of the eyeball, whereby the gaze of the user is detected.

A display device according to an embodiment of the present invention may include an image pickup device including a light-receiving element and may control a displayed image on the display device on the basis of the gaze information of the user from the image pickup device.

Specifically, the display device determines, on the basis of the gaze information, a first visual field at which the user gazes and a second visual field other than the first visual field. The first visual field and the second visual field may be determined by the controller of the display device, or may be determined by an external controller and sent therefrom. In a display area of the display device, the display resolution of the first visual field may be controlled to be higher than the display resolution in the second visual field. That is, the resolution in the second visual field may be set to be lower than that in the first visual field.

The display area includes a first display area and a second display area different from the first display area, and an area of high priority is determined from the first display area and the second display area on the basis of the gaze information. The first visual field and the second visual field may be determined by the controller of the display device, or may be determined by an external controller and sent therefrom. The resolution in the area of high priority may be controlled to be higher than the resolution in the area other than the area of high priority. That is, the resolution in an area of relatively low priority may be set to be lower.

AI may be used to determine the first visual field or the area of high priority. AI may be a model configured to estimate, from an image of an eyeball, the angle of gaze and the distance to an object gazed, by using the image of the eyeball and the actual direction of gaze of the eyeball in the image as teaching data. The AI program may be included in the display device, the image pickup device, or an external device. When the AI program is included in the external device, it is transmitted to the display device via communications.

When display control is performed on the basis of visual recognition, smart glasses further including an image pickup device that captures an external image are suitable for use. Smart glasses can display captured external information in real time.

As described above, the use of an apparatus including the organic light-emitting element according to this embodiment enables a stable display with good image quality over a long period of time.

EXAMPLES

Examples will be described below. It should be noted however, that the present invention is not limited to these Examples.

Example 1

Synthesis of Exemplary Compound 25

Exemplary compound 25 was synthesized as described below.

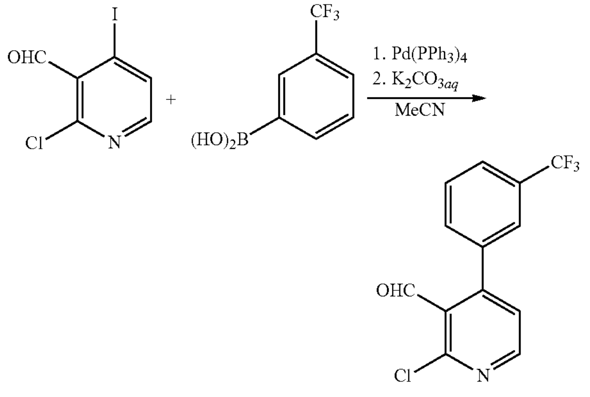

In a nitrogen atmosphere, 3.72 g of 3-trifluoromethylphenylboronic acid, 5.0 g of 2-chloro-3-formyl-4-iodopyridine, 40 mL of toluene, 20 mL of ethanol, 40 mL of water, and 5.94 g of sodium carbonate were added to a 200 mL recovery flask. The temperature was raised from room temperature to 90° C., and stirring was performed for 12 hours. Toluene and water were added to the resulting mixture to extract an organic layer. Magnesium sulfate was added to the organic layer, and filtration was performed. After concentration, the resulting product was put through a column using a hexane solution containing 15% ethyl acetate. The resulting liquid was concentrated to obtain 4.16 g of intermediate 1. Its structure was identified by $^1$H-NMR and GC-MS.

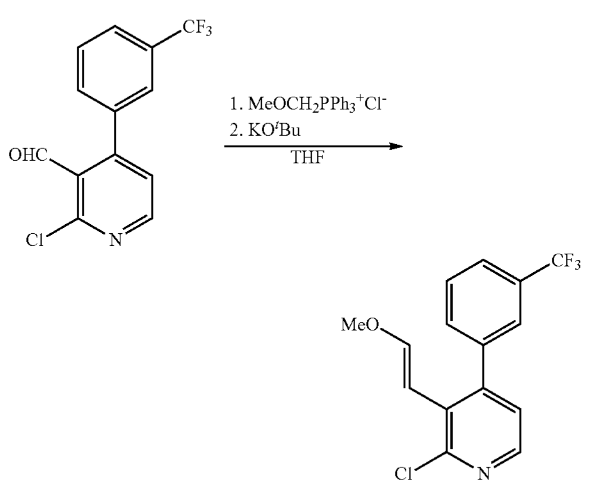

In a nitrogen atmosphere, 7.2 g of (methoxymethyl) triphenylphosphonium chloride and 60 mL of dehydrated THF were added to a 200 mL three-necked recovery flask and stirred. While the reaction vessel was cooled in an ice bath, 3.14 g of potassium tert-butoxide was added in one portion as it was in the form of powder, and stirring was performed for 30 minutes while the reaction vessel was left in the ice bath. After 30 minutes, 4.0 g of intermediate 1 was added as it was in the form of powder. The temperature was returned to room temperature, and stirring was performed for 1 hour. Toluene and water were added to the resulting mixture to extract an organic layer. Magnesium sulfate was added to the organic layer, and filtration was performed. After concentration, the resulting product was put through a column using a hexane solution containing 15% ethyl acetate. The resulting liquid was concentrated to obtain 3.95 g of intermediate 2. Its structure was identified by $^1$H-NMR and GC-MS.

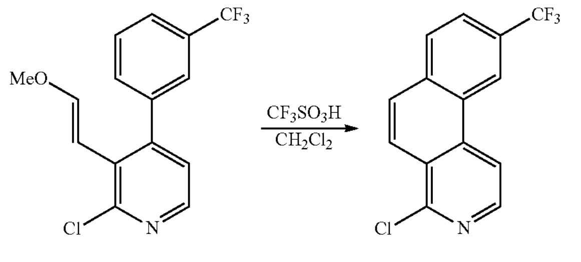

In a nitrogen atmosphere, 3.5 g of intermediate 2 and 40 mL dichloromethane were added to a 200 mL recovery flask. While the reaction vessel was cooled in an ice bath, 8.37 g of trifluoromethanesulfonic acid was added dropwise. The temperature was returned to room temperature, and stirring was performed for 5 hours. Dichloromethane and water added to the resulting mixture to extract an organic layer. Magnesium sulfate was added to the organic layer, and filtration was performed. After concentration, the resulting product was put through a column using a hexane solution containing 15% ethyl acetate. The resulting liquid was concentrated to obtain 2.67 g of intermediate 3. Its structure was identified by $^1$H-NMR and GC-MS.

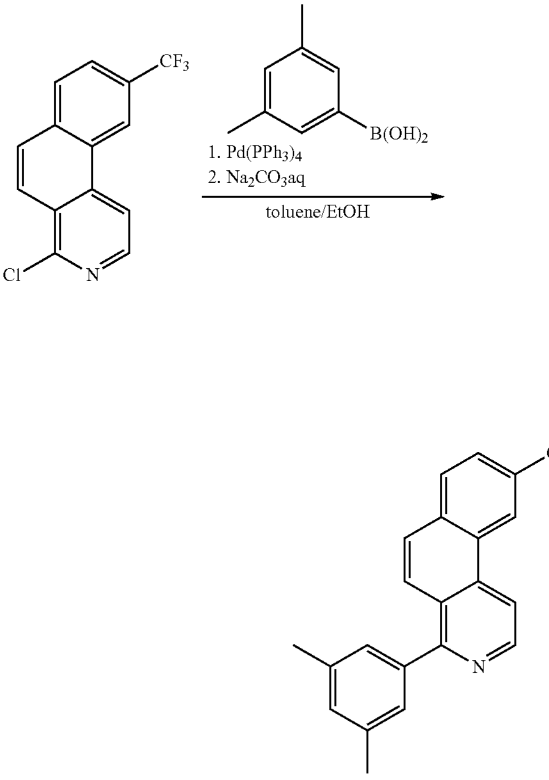

In a nitrogen atmosphere, 2.5 g of intermediate 3, 1.6 g of 3,5-dimethylphenylboronic acid, 0.51 g of tetrakis triphenylphosphine palladium, 50 mL of toluene, 25 mL of ethanol, 50 mL of water, and 2.82 g of sodium carbonate were added to a 300 mL recovery flask. The temperature was raised from room temperature to 90° C., and stirring was performed for 12 hours. Toluene and water were added to the resulting mixture to extract an organic layer. Magnesium sulfate was added to the organic layer, and filtration was performed. After concentration, the resulting product was put through a column using a hexane solution containing 25% ethyl acetate. The resulting liquid was concentrated to obtain 2.24 g of intermediate 4. Its structure was identified by $^1$H-NMR and GC-MS.

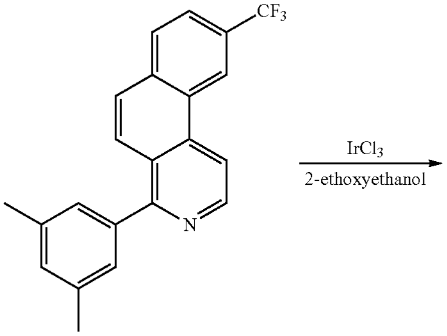

-continued

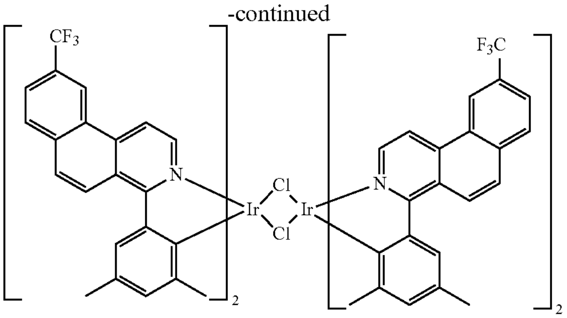

In a nitrogen atmosphere, 2.0 g of intermediate 4, 0.91 g of iridium chloride trihydrate, 100 mL of 2-ethoxyethanol, and 30 mL of water were added to a 300 mL recovery flask. The temperature was raised from room temperature to 120° C., and stirring was performed for 20 hours. Water was added to the resulting mixture, and a precipitated solid was filtered. The residual solid was washed with methanol and hexane to obtain 1.80 g of intermediate 6.

Exemplary Compound 25

In a nitrogen atmosphere, 1.5 g of intermediate 6, 0.84 g of dipivaloylmethane, 100 mL of 2-ethoxyethanol, and 0.48 g of sodium carbonate were added to a 300 mL recovery flask. The temperature was raised from room temperature to 120° C., and stirring was performed for 5 hours. Water was added to the resulting mixture, and a precipitated solid was filtered. The residual solid was washed with methanol to obtain 1.32 g of exemplary compound 25 of interest.

Exemplary compound 25 obtained was measured for halogen content by combustion ion chromatography, revealing that the Cl content was 1.0 ppm. The results are shown in Example 2 in Table 1.

Exemplary compound 25 synthesized was dissolved in toluene at a concentration of $1.0\times10^{-5}$ mol/L, and a PL (photoluminescence) spectrum was measured. The spectrum exhibited red light emission at an emission wavelength of 609 nm. Furthermore, a composition containing EM40 dissolved in chlorobenzene and exemplary compound 25 (3 wt %) was formed into a film by a spin coating method, and a PL spectrum was measured. The spectrum exhibited red light emission at an emission wavelength of 631 nm.

Comparative Example 1 and Comparative Example 22

Compound A to compound D below, serving as luminescent iridium complexes for use in the device evaluation of

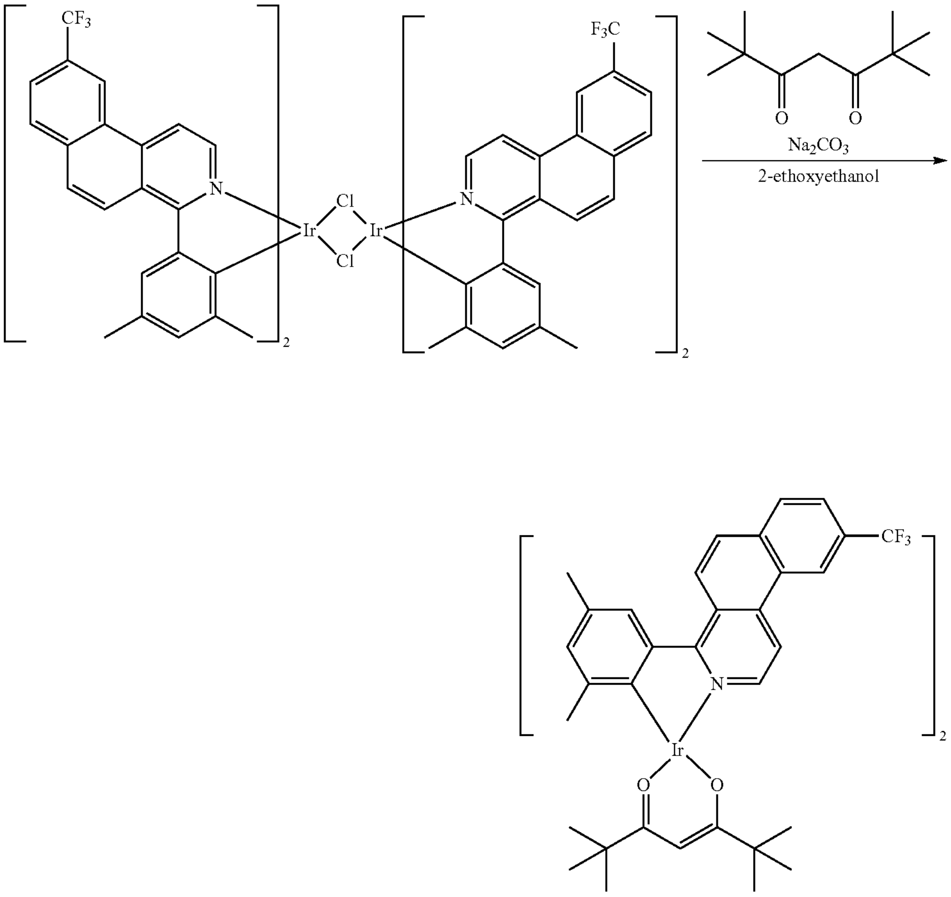

Comparative Example 1 to Comparative Example 8, were synthesized in the same manner as in Example 1.

Compound A

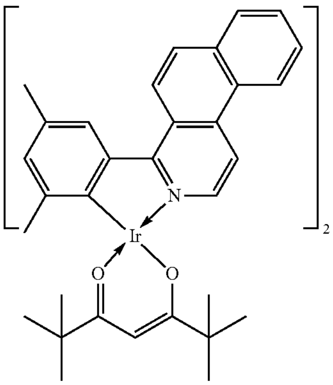

Compound B

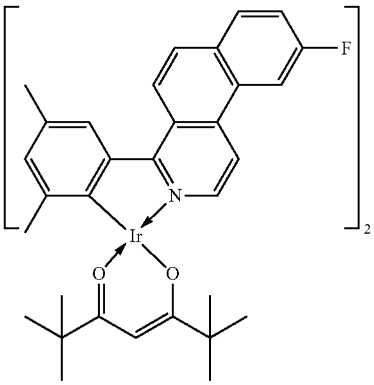

Compound C

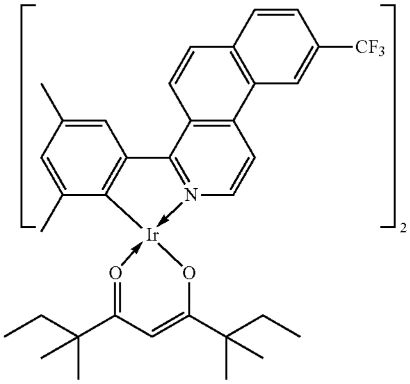

Compound D

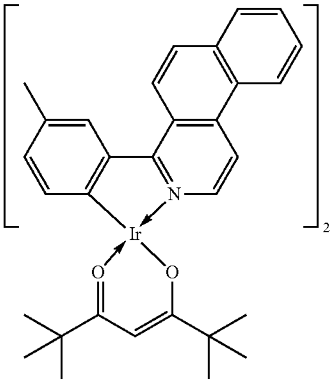

These comparative compounds were also measured for halogen content by combustion ion chromatography as with exemplary compound 25 above, revealing that the Cl content was as follows: compound A, 0.8 ppm; compound B, 1.2 ppm; compound C, 1.6 ppm; compound D, 1.2 ppm. The halogen content of compound A to compound D synthesized in another lot in the same manner as in Example 1 was as follows: compound A, 2.2 ppm; compound B, 3.3 ppm; compound C, 3.1 ppm; compound D, 4.8 ppm. Furthermore, compound A to compound D, compound (10), compound (25), and compound (37), serving as luminescent iridium complexes for use in the device evaluation of Comparative Example 9 to Comparative Example 22, were synthesized in the manner described in PTL 1, and their halogen content was measured in the same manner as in Example 1. The results are shown in Table 1.

In Comparative Example 1, using compound A (halogen content: 0.8 ppm) as a guest compound, an organic light-emitting element having a structure in which an anode/a hole injection layer/a hole transport layer/an electron blocking layer/a light-emitting layer/a hole blocking layer/an electron transport layer/a cathode were sequentially disposed on a substrate was produced in a manner described below.

A glass substrate on which an ITO film as an anode was formed by sputtering so as to be 100 nm thick was used as a transparent conductive supporting substrate (ITO substrate). On this ITO substrate, organic compound layers and electrode layers shown below were successively formed through vacuum deposition by resistance heating in a vacuum chamber at $10^{-5}$ Pa such that the electrode area was 3 $mm^2$.

Hole injection layer (10 nm) HT16
Hole transport layer (30 nm)
Electron blocking (EB) layer (10 nm)
Light-emitting layer (30 nm) host material, guest material: compound A (4 wt %)
Hole blocking (HB) layer (20 nm)
Electron transport layer (20 nm)
Metal electrode layer 1 (1 nm) Liq
Metal electrode layer 2 (100 nm) Al Next, the organic light-emitting element was covered with a protective glass plate in a dry air atmosphere and sealed with an acrylic resin adhesive to prevent the element from deteriorating due to moisture adsorption. In this manner, the organic light-emitting element was obtained. The organic light-emitting element obtained was measured for operating lifetime by supplying a constant current of 20 $mA/cm^2$ between the ITO electrode as an anode and the Al electrode as a cathode, revealing that $LT_{95}$ (time (hr) taken for luminance to attenuate to 95% of initial luminance) was 85 hours. In Comparative Example 2, an organic light-emitting element was produced in the same manner using compound A (halogen content: 2.2 ppm) synthesized in another lot and measured for operating lifetime, revealing that $LT_{95}$ was 80 hours.

In Comparative Example 3 to Comparative Example 22, organic light-emitting elements were each produced in the same manner as in Comparative Example 1 except that the guest material was replaced with compound B, compound C, compound D, exemplary compound (10), exemplary compound (25), or exemplary compound (37). The elements obtained were measured for operating lifetime in the same manner as in Comparative Example 1.

Example 2 to Example 8

In these Examples, elements were each produced in the same manner as in Comparative Example 1 except that the guest material of the light-emitting layer was replaced with exemplary compound (25), exemplary compound (34), exemplary compound (10), or exemplary compound (37). The elements obtained were evaluated in the same manner as in Comparative Example 1. The results are shown in Table 1.

In Examples 2 to 8, which are compounds according to the present invention in each of which a benzoisoquinoline skeleton has a $CF_3$ group as an electron-withdrawing substituent and an ancillary ligand is provided only with methyl groups which are alkyl groups having one carbon atom, $LT_{95}$ values are larger than those of compounds (compound A and compound D) in each of which a benzoisoquinoline skeleton is not provided with an electron-withdrawing substituent, a compound (compound B) having a weak electron-withdrawing group, and a compound (compound C) including an ancillary ligand having more than one carbon atom, indicating significant improvements in operating lifetime. As described above, using a ligand having a specific substituent and an ancillary ligand having a specific substituent can improve durability.

The increase (hr) in operating lifetime ($LT_{95}$) per ppm of halogen content calculated based on the results in Table 1 is shown in Table 2. It has been confirmed that exemplary compound (25), exemplary compound (10), and exemplary compound (37) according to the present invention, as compared to known compound A and compound D, exhibit a large increase in operating lifetime per ppm of halogen content reduction, particularly in the case of a halogen content of less than 5 ppm. That is, the durability-improving effect of the compositions according to the present invention resulting from the reduction in residual halogen content to less than 5 ppm are significantly greater than those of conventional compounds.

TABLE 1

| Organic light-emitting element production example | Compound | Halogen content (ppm) | LT95 (hr) |
|---|---|---|---|
| Comparative Example 1 | Compound A | 2.2 | 80 |
| Comparative Example 2 | Compound A | 0.8 | 85 |
| Comparative Example 3 | Compound B | 3.3 | 105 |
| Comparative Example 4 | Compound B | 1.2 | 115 |
| Comparative Example 5 | Compound C | 3.1 | 130 |
| Comparative Example 6 | Compound C | 1.6 | 135 |
| Comparative Example 7 | Compound D | 4.8 | 50 |
| Comparative Example 8 | Compound D | 1.2 | 60 |
| Comparative Example 9 | Compound A | 5.9 | 55 |
| Comparative Example 10 | Compound A | 9.5 | 45 |
| Comparative Example 11 | Compound B | 11.1 | 95 |
| Comparative Example 12 | Compound B | 13.0 | 90 |
| Comparative Example 13 | Compound C | 9.7 | 115 |
| Comparative Example 14 | Compound C | 12.0 | 110 |
| Comparative Example 15 | Compound D | 9.5 | 40 |
| Comparative Example 16 | Compound D | 6.9 | 35 |
| Comparative Example 17 | Compound (25) | 8.3 | 190 |
| Comparative Example 18 | Compound (25) | 9.8 | 185 |
| Comparative Example 19 | Compound (10) | 9.5 | 165 |
| Comparative Example 20 | Compound (10) | 11.6 | 160 |
| Comparative Example 21 | Compound (37) | 5.5 | 185 |
| Comparative Example 22 | Compound (37) | 7.3 | 190 |
| Example 2 | Compound (25) | 1.0 | 225 |
| Example 3 | Compound (34) | 0.8 | 200 |
| Example 4 | Compound (25) | 3.6 | 200 |
| Example 5 | Compound (10) | 1.1 | 190 |
| Example 6 | Compound (10) | 2.3 | 180 |
| Example 7 | Compound (37) | 1.4 | 215 |
| Example 8 | Compound (37) | 0.9 | 210 |

TABLE 2

| | Increase (hr) in operating lifetime (LT95) per ppm of halogen content reduction | |
|---|---|---|
| Compound | Halogen content 5 ppm or more | Halogen content less than 5 ppm |
| Compound A | 2.8 | 3.6 |
| Compound B | 2.6 | 4.8 |
| Compound C | 2.2 | 3.3 |
| Compound D | 1.9 | 2.8 |
| Compound (25) | 3.3 | 9.6 |
| Compound (10) | 2.4 | 8.3 |
| Compound (37) | 2.8 | 10.0 |

As described above, it has been found that the iridium complex according to the present invention can provide an organic light-emitting element with improved lifetime.

According to the present invention, a composition containing an iridium complex having high durability can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A composition comprising:

an iridium complex represented by general formula (1) below; and a halogen atom, wherein a content of the halogen atom is less than 5 ppm, (1)

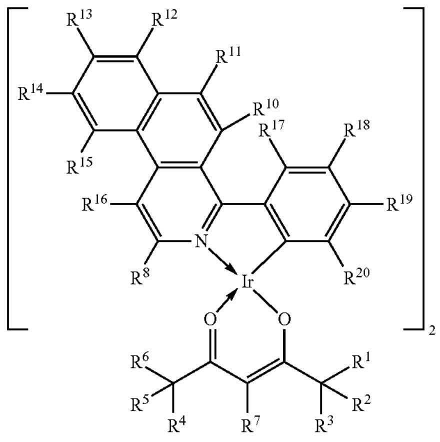

where, in general formula (1), $R^8$ to $R^{20}$ are each independently selected from a hydrogen atom, a halogen atom, a substituted or unsubstituted alkyl group, a substituted or unsubstituted aryl group, a substituted or unsubstituted heterocyclic group, a substituted or unsubstituted alkoxy group, a substituted or unsubstituted aryloxy group, a cyano group, and a silyl group, provided that $R^{14}$ is an electron-withdrawing substituent having a Hammett constant cam of 0.3 or more, and $R^1$ to $R^7$ are each a hydrogen atom or a methyl group.

2. The composition according to claim 1, wherein $R^{14}$ is selected from —$CF_3$, —CN, —$OCF_3$, —$COCH_3$, and —$COOCH_3$.

3. The composition according to claim 1, wherein $R^{18}$ and $R^{20}$ are each a substituted or unsubstituted alkyl group.

4. The composition according to claim 3, wherein $R^{18}$ and $R^{20}$ are each an alkyl group having 1 to 4 carbon atoms.

5. The composition according to claim 4, wherein $R^{18}$ and $R^{20}$ are each a methyl group.

6. The composition according to claim 1, represented by a structural formula below:

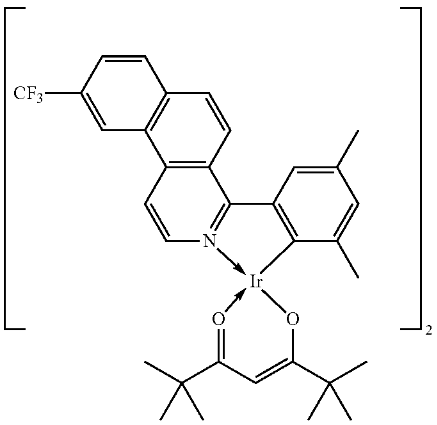

7. An ink composition comprising:

the composition according to claim 1;

a first organic compound having a lowest excited triplet energy higher than a lowest excited triplet energy of the iridium complex contained in the composition;

and a solvent.

8. An organic light-emitting element comprising:

a first electrode;

a second electrode; and an organic compound layer disposed between the first electrode and the second electrode, wherein the organic compound layer contains the composition according to claim 1.

9. The organic light-emitting element according to claim 8, wherein the organic compound layer includes a light-emitting layer, and the light-emitting layer contains the composition.

10. The organic light-emitting element according to claim 9, wherein the light-emitting layer contains the composition and a first organic compound, and the first organic compound has a higher lowest excited singlet energy than the iridium complex contained in the composition.

11. The organic light-emitting element according to claim 10, wherein the light-emitting layer contains a second organic compound different from the first organic compound, and the second organic compound has a lowest excited triplet energy lower than that of the first organic compound and higher than that of the iridium complex.

12. A display devise comprising a plurality of pixels, wherein at least one of the plurality of pixels includes the organic light-emitting element according to claim 8 and a transistor connected to the organic light-emitting element.

13. An image pickup device comprising:

an optical unit including a plurality of lenses;

an image pickup element configured to receive light that has passed through the optical unit; and a display unit configured to display an image captured by the image pickup element, wherein the display unit includes the organic light-emitting element according to claim 8.

14. An electronic device comprising:

a display unit including the organic light-emitting element according to claim 8;

a housing provided with the display unit; and a communication unit provided in the housing and configured to communicate with an external device.

15. An illumination apparatus comprising:

a light source including the organic light-emitting element according to claim 8; and a light diffusion unit or an optical filter configured to transmit light emitted from the light source.

16. A moving object comprising:

a lighting fixture including the organic light-emitting element according to claim 8; and a body provided with the lighting fixture.

* * * * *